US011736150B2

(12) United States Patent
Wang et al.

(10) Patent No.: US 11,736,150 B2
(45) Date of Patent: Aug. 22, 2023

(54) COMPACT LOW-LOSS REFLECTION TYPE PHASE SHIFTER

(71) Applicant: QUALCOMM Incorporated, San Diego, CA (US)

(72) Inventors: Chuan Wang, San Diego, CA (US); Maziar Hedayati, Los Angeles, CA (US); Bhushan Shanti Asuri, San Diego, CA (US); Muhammad Hassan, San Diego, CA (US); Chinmaya Mishra, San Diego, CA (US); Anosh Davierwalla, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/485,364

(22) Filed: Sep. 25, 2021

(65) Prior Publication Data

US 2023/0095788 A1     Mar. 30, 2023

(51) Int. Cl.
*H04B 5/00* (2006.01)
*H01Q 3/36* (2006.01)
*H03H 7/20* (2006.01)

(52) U.S. Cl.
CPC ............ *H04B 5/0081* (2013.01); *H01Q 3/36* (2013.01); *H03H 7/20* (2013.01)

(58) Field of Classification Search
None
See application file for complete search history.

(56) References Cited

U.S. PATENT DOCUMENTS

| 2010/0171567 | A1  |   | 7/2010 | Krishnaswamy et al. |
|---|---|---|---|---|
| 2012/0105172 | A1 | * | 5/2012 | Tsai .................. H03H 7/20 333/139 |
| 2022/0182015 | A1 | * | 6/2022 | Wang .................. H03C 7/025 |

FOREIGN PATENT DOCUMENTS

| CN | 101951232 A | * | 1/2011 | |
|---|---|---|---|---|
| WO | WO-2021035752 A1 | * | 3/2021 | ............. H03C 7/025 |

OTHER PUBLICATIONS

International Search Report and Written Opinion—PCT/US2022/075928—ISA/EPO—dated Nov. 23, 2022.
Li T-W., et al., "A Millimeter-Wave Fully Differential Transformer-Based Passive Reflective-Type Phase Shifter", 2015 IEEE Custom Integrated Circuits Conference (CICC), IEEE, Sep. 28, 2015, pp. 1-4, XP032816989, Section I-III, figures 1,2,4,6.
Yishay R. B., et al., "Low Loss 28 GHz Digital Phase Shifter for 5G Phased Array Transceivers", 2018 Asia-Pacific Microwave Conference (APMC), IEICE, Nov. 6, 2018, pp. 711-713, XP033500490, Section I-III, figures 1-5.

* cited by examiner

*Primary Examiner* — Daniel C Puentes
(74) *Attorney, Agent, or Firm* — Polsinelli/Qualcomm

(57) ABSTRACT

Aspects of the present relate to reflection type phase shifters for radio frequency (RF) wireless devices. Reflection type phase structures in accordance with aspects described herein can improve device performance with compact configurations, such as where magnetic and capacitive coupling is integrated into a device design to integrate interactions between elements for improved phase shifting performance in a compact design with wideband performance.

29 Claims, 13 Drawing Sheets

COMPACT LOW-LOSS REFLECTION TYPE PHASE SHIFTER

FIELD

The present disclosure relates generally to electronics, and more specifically to reflection type phase shifters for radio frequency (RF) wireless devices.

BACKGROUND

Wireless communication devices and technologies are becoming ever more prevalent. Wireless communication devices generally transmit and receive communication signals. A communication signal is typically processed by a variety of different components and circuits. In some modern communication systems, a communication beam may be formed and steered in one or more directions. One type of beam steering system uses what is referred to as phased array, or phased array antenna system. A phased array may use a number of different elements and antennas where each element may process a transmit and/or receive signal that is offset in phase by some amount, leading to different elements of a phased array system processing slightly phase-shifted versions of a transmit and/or a receive signal. A phased array system may produce narrow, steerable, high power communication beams. A phased array antenna system may also form part of a massive multiple-input, multiple-output (MIMO) system.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Aspects described herein include wireless devices with phased array systems. To achieve orthogonal beam steering control and sidelobe suppression in such devices, phase and amplitude control in phased array system elements are independent. The phase shifter in such elements impacts beam forming with phase resolution and phase shifting range characteristics. At the same time, device size is an important aspect of performance. Reflection type phase shifters, in addition to consuming zero direct current power and having high linearity, can be configured for a single phase shifter for a transmit (Tx) receive (Rx) element due to the bidirectionality of reflection type phase shifters (e.g., TRx reciprocity).

Reflection type phase structures in accordance with aspects described herein can further improve device performance with compact configurations where magnetic and capacitive coupling is integrated into a device design to integrate interactions between elements for improved phase shifting performance in a compact design with wideband performance. Examples described herein provide wideband compact low loss bi-directional reflection type phase shifters for improved wireless front-end solutions.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

In some aspects, a wireless communication apparatus is provided, comprising: a reflective coupler with a tuned termination comprising a first reflection signal terminal, a second reflection signal terminal, a third reflection signal terminal, and a fourth reflection signal terminal; a first variable capacitive element coupled from the first reflection signal terminal to the second reflection signal terminal; a second variable capacitive element coupled from the third reflection signal terminal to the fourth reflection signal terminal; a first inductive element having a first end and a second end, wherein the first end of the first inductive element is coupled to the first reflection signal terminal; a second inductive element having a first end coupled to the second end of the first inductive element, and a second end coupled to the third reflection signal terminal; a third inductive element having a first end and a second end, wherein the first end of the third inductive element is coupled to the second reflection signal terminal; a fourth inductive element having a first end coupled to the second end of the third inductive element, and a second end coupled to the fourth reflection signal terminal; a third variable capacitive element coupled from the second end of the first inductive element and the first end of the third inductive element; and a fourth variable capacitive element coupled from the second end of the second inductive element to the first end of the fourth inductive element.

In some aspects, the first variable capacitive element, the second variable capacitive element, the third variable capacitive element, and the fourth variable capacitive element are positioned to create a moderate capacitive coupling.

In some aspects, the first inductive element, the second inductive element, the third inductive element, and the fourth inductive element are positioned to create a moderate magnetic coupling.

In some aspects, moderate magnetic coupling results in a coupling value between inductive elements of between 0.3 and 0.5.

In some aspects, the moderate capacitive coupling is approximately between 30 and 50 femtofarads (fF).

In some aspects, the first variable capacitive element and the second variable capacitive element have a shared capacitive value.

In some aspects, the shared capacitive value is tunable in a range from 60 fF to 140 fF.

In some aspects, the apparatus further includes control circuitry coupled to the first variable capacitive element, the second variable capacitive element, the third variable capacitive element, and the fourth variable capacitive element, wherein the control circuitry is configured to select capacitive values to set a phase shift value.

In some aspects, the apparatus further includes control a phase shift component comprising a first phase shift input, a second phase shift input, the first reflection signal terminal, the second reflection signal terminal, the third reflection signal terminal, the fourth reflection signal terminal, a first phase shift output, and a second phase shift output.

In some aspects, the apparatus further includes control a variable gain amplifier coupled to the phase shift component.

In some aspects, the variable gain amplifier comprises a bi-directional single-ended input, a gain control, a phase calibration element, amplitude control circuitry, and a bi-directional single ended output.

In some aspects, the apparatus further includes control a transmit path coupled to the variable gain amplifier.

In some aspects, the wireless communication apparatus comprises a bi-directional reflection type phase shifter.

In some aspects, the wireless communication apparatus comprises a phased array element.

In some aspects, the phased array element further includes a transmit path and a receive path, wherein the transmit path comprises the bi-directional reflection type phase shifter, and wherein the receive path comprises the bi-directional reflection type phase shifter.

In some aspects, the wireless communication apparatus comprises a millimeter wave integrated circuit (mmWIC).

In some aspects, the mmWIC comprises a plurality of phased array elements, and wherein a first phased array element of the plurality of phased array elements comprises the first variable capacitive element, the second variable capacitive element, the third variable capacitive element, the fourth variable capacitive element, the first inductive element, the second inductive element, the third inductive element, and the fourth inductive element.

In some aspects, each phased array element of the plurality of phased array elements comprises a bi-directional reflection type phase shifter.

In some aspects, the moderate capacitive coupling and the moderate magnetic coupling are created using a coupled transformer layout for the first variable capacitive element, the second variable capacitive element, the third variable capacitive element, the fourth variable capacitive element, the first inductive element, the second inductive element, the third inductive element, and the fourth inductive element.

In some aspects, the coupled transformer layout uses two layers of a millimeter wave integrated circuit (mmWIC) and a surface area of the mmWIC is approximately 95 micrometers (urn) by 135 um.

In some aspects, the moderate capacitive coupling and the moderate magnetic coupling are created using a differential quadrature hybrid layout for the first variable capacitive element, the second variable capacitive element, the third variable capacitive element, the fourth variable capacitive element, the first inductive element, the second inductive element, the third inductive element, and the fourth inductive element.

In some aspects, a wireless communication apparatus is provided comprising: a 90-degree differential reflective coupler with a tunable termination comprising a first reflection signal terminal, a second reflection signal terminal, a third reflection signal terminal, a fourth reflection signal terminal, a bi-directional differential input, and a bi-direction differential output; a first inductive element having a first end and a second end, wherein the first end is coupled to the first reflection signal terminal; a second inductive element having a first end and a second end, wherein the second end is coupled to the second reflection signal terminal; a third inductive element having a first end and a second end, wherein the first end is coupled to the third reflection signal terminal; a fourth inductive element having a first end and a second end, wherein the second end is coupled to the fourth reflection signal terminal; a first variable capacitive element coupled from the first reflection signal terminal to the second reflection signal terminal; a second variable capacitive element coupled from the third reflection signal terminal to the fourth reflection signal terminal; a third variable capacitive element coupled from the second end of the first inductive element to the first end of the second inductive element; a fourth variable capacitive element coupled from the second end of the third inductive element to the first end of the fourth inductive element.

In some aspects, the first variable capacitive element, the second variable capacitive element, the third variable capacitive element, and the fourth variable capacitive element are positioned to create a moderate capacitive coupling.

In some aspects, the moderate capacitive coupling is approximately 40 femtofarads (fF).

In some aspects, the first inductive element, the second inductive element, the third inductive element, and the fourth inductive element are positioned to create a moderate magnetic coupling.

In some aspects, the moderate magnetic coupling results in a coupling value between inductive elements of between 0.3 and 0.5.

In some aspects, the wireless communication apparatus further comprises a first transformer coupled across the bi-directional differential input; and a second transformer coupled across the bi-directional differential output.

In some aspects, a method for operating a wireless apparatus is provided, the method comprising: receiving a communication signal; and adjusting a phase of the communication signal using a bi-directional reflection type phase shifter comprising: a phase shifter; and variable load terminations coupled to the phase shifter, the variable load terminations comprising a plurality of variable capacitive elements and a plurality of inductive elements; wherein the plurality of variable capacitive elements are positioned to create a moderate capacitive coupling sufficient to impact an insertion loss at an apparatus operating frequency; and wherein the plurality of inductive elements are positioned to create a magnetic coupling between the plurality of inductive elements sufficient to impact the insertion loss at the apparatus operating frequency.

In some aspects, the phase shifter includes a 90-degree phase shifter.

In some aspects, the apparatuses described above can include a mobile device with a camera for capturing one or more pictures. In some aspects, the apparatuses described above can include a display for displaying one or more pictures. The summary is not intended to identify key or essential features of the claimed subject matter, nor is it intended to be used in isolation to determine the scope of the claimed subject matter. The subject matter should be understood by reference to appropriate portions of the entire specification, any or all drawings, and each claim.

The foregoing, together with other features and embodiments, will become more apparent upon referring to the following specification, claims, and accompanying drawings.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

Figure 1:
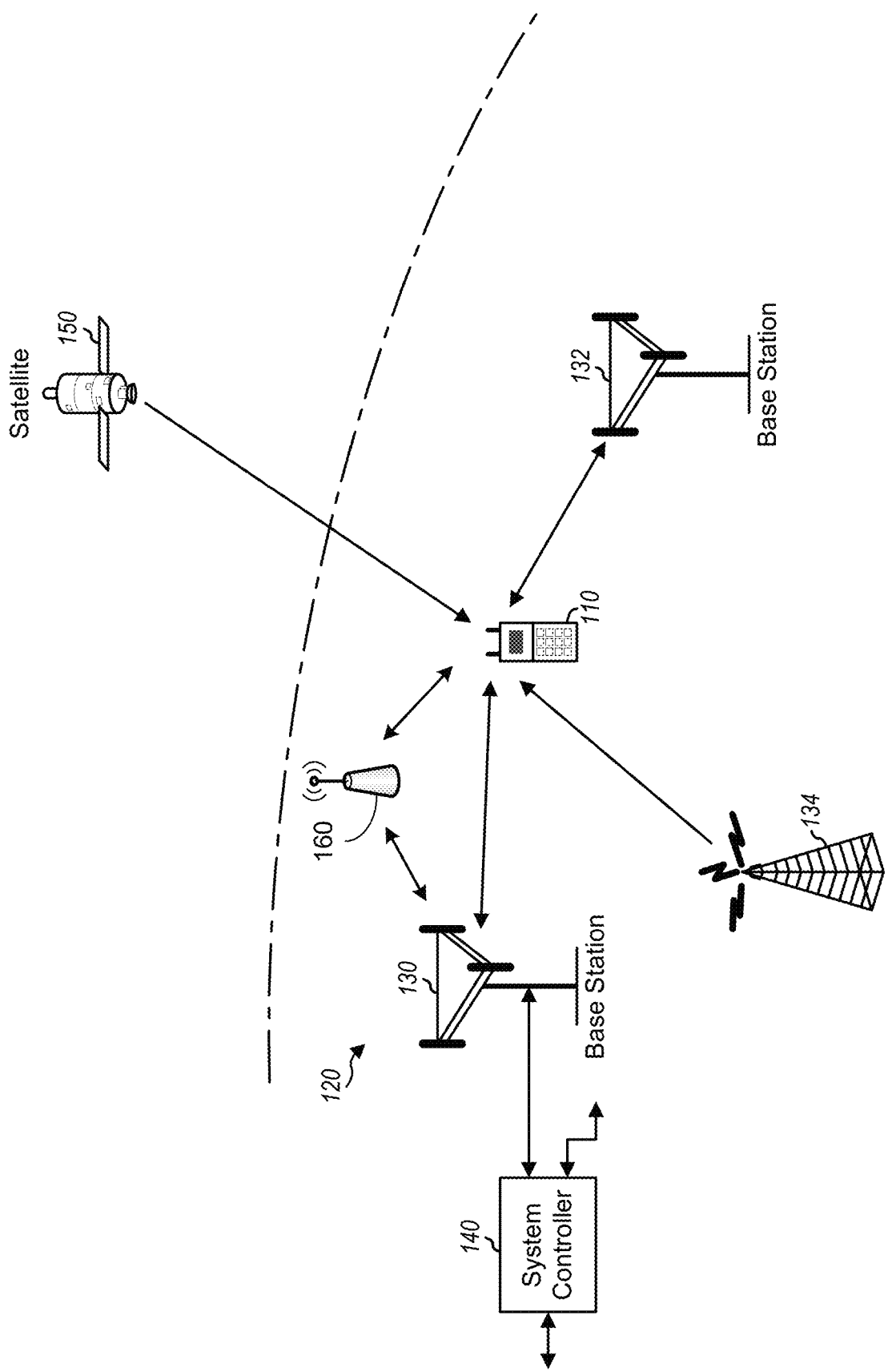
FIG. 1 is a diagram showing a wireless device communicating with a wireless communication system.

The detailed description set forth below in connection with the appended drawings is intended as a description of exemplary implementations and is not intended to represent the only implementations in which the invention may be practiced. The term "exemplary" used throughout the description means "serving as an example, instance, or illustration," and should not necessarily be construed as preferred or advantageous over other exemplary implementations. The detailed description includes specific details for the purpose of providing a thorough understanding of the exemplary implementations. In some instances, some devices are shown in block diagram form. Drawing elements that are common among the following figures may be identified using the same reference numerals.

Aspects described herein include improved reflection type phase shifters. Such phase shifters can be used with wireless devices having phased array systems. In wireless communication systems, orthogonal beam steering with sidelobe suppression is a tool for improving communication performance. To achieve orthogonal beam steering control and sidelobe suppression, phase and amplitude control in phased array system elements are used. The phase shifter in such elements controls phase resolution and phase shifting range characteristics, which further impact communication performance. Additionally, device size is an important aspect of performance in wireless devices. Reflection type phase shifters described herein are bi-directional, and so a single phase shifter can be used in both a transmit and a receive chain of a phased array element, reducing space usage compared with other phase shifters that are not bi-directional (e.g. requiring a phase shifter for each transmit or receive path). Additionally, example reflection type phase shifters described herein have no direct current (DC) power consumption and have increased linearity compared with certain configurations of switch type phase shifters.

Reflection type phase structures in accordance with aspects described herein can further improve device performance with compact configurations where magnetic and capacitive coupling is integrated into a device design to integrate interactions between elements for improved phase shifting performance in a compact design with wideband performance. Due to the passive operation and the bi-directional nature of reflection type phase shifters, reflection type structures described herein can be used as shared phase shifters between transmitters and receivers, so that the overall area of phase array transceivers, or front-end modules, can be greatly reduced compared with previous devices. Examples described herein can provide wideband compact low loss bi-directional reflection type phase shifters for improved wireless front-end solutions.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

In some aspects, a reflection type phase shifter is described with two inputs and two outputs, where capacitive and inductive elements coupled to the inputs and outputs are configured to use both the characteristics of the elements as well as resonance coupling between the elements to achieve device performance with reduced (e.g., improved) insertion loss performance. Configuration of the capacitive and inductive elements can, in various implementations, be created using a differential quadrature hybrid structure, a coupled transformer structure, or other such compact structures to provide improved and compact reflective phase shift performance.

Some aspects include a reflection type phase shifter integrated with phased array elements and other transmission (Tx) and receive (Rx) elements as part of a millimeter wave integrated circuit (mmWIC). Such an mmWIC can further be configured as part of a mobile device, a tablet, a personal computer, or other such wireless devices. Details and additional aspects of compact low-loss reflection type phase shifters and various systems, devices, and apparatuses which can use such phase shifters are described below.

FIG. 1 is a diagram showing a wireless device 110 communicating with a wireless communication system 120. Wireless device 110 and all other devices within wireless communication system 120 can use reflection type phase shifters in accordance with aspects described herein. The wireless communication system 120 may be a Long Term Evolution (LTE) system, a Code Division Multiple Access (CDMA) system, a Global System for Mobile Communications (GSM) system, a wireless local area network (WLAN) system, a 5G NR (new radio) system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities. Any such devices can be implemented with reflective type phase shifters in accordance with aspects described herein.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134) and/or signals from satellites (e.g., a satellite 150 in one or more global navigation satellite systems (GNSS), etc). Wireless device 110 may support one or more radio technologies for wireless communication such as LTE, WCDMA, CDMA 1X, EVDO, TD-SCDMA, GSM, 802.11, 5G, etc.

The wireless communication system 120 may also include a wireless device 160. In some aspects, the wireless device 160 may be a wireless access point, or another wireless communication device that comprises, or comprises part of a wireless local area network (WLAN). In some aspects, the wireless device 110 may configured as a customer premises equipment (CPE), which may be in communication with a base station 130 and another wireless device 110, or other devices in the wireless communication system 120. In some embodiments, the CPE may be configured to communicate with the wireless device 160 using WAN signaling and to interface with the base station 130 based on such communication instead of the wireless device 160 directly communicating with the base station 130. In exemplary embodiments where the wireless device 160 is configured to communicate using WLAN signaling, a WLAN signal may include WiFi, or other communication signals.

Figure 2A:
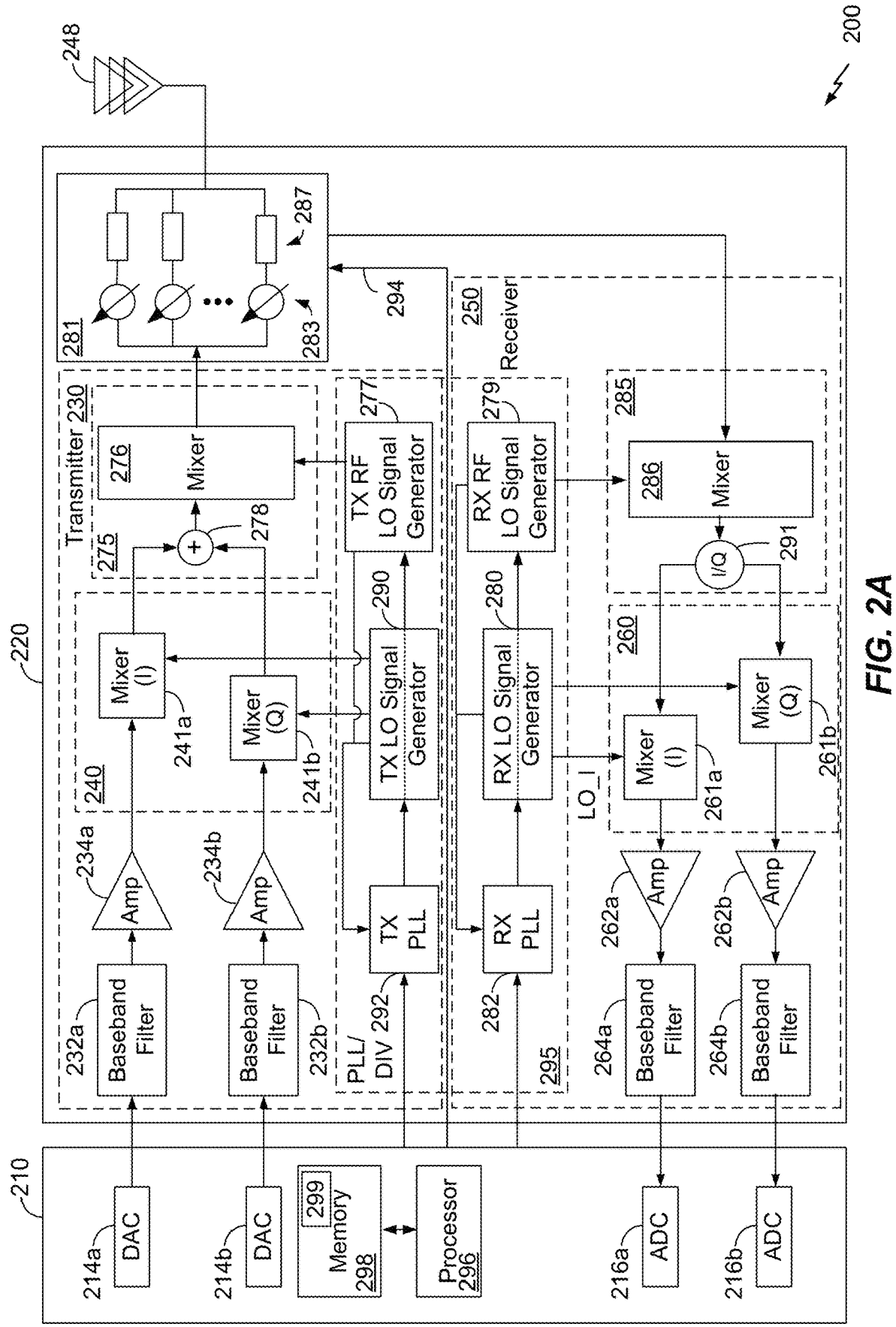
FIG. 2A is a block diagram showing a wireless device in which aspects of the present disclosure may be implemented.

FIG. 2A is a block diagram showing a wireless device 200 in which the compact low-loss reflection type phase shifter of the present disclosure may be implemented. The wireless device 200 may, for example, be an embodiment of the wireless device 110 illustrated in FIG. 1. In some examples, the wireless device 200 (or any of the devices described and/or illustrated hereinafter) may be an example of any of the devices illustrated in FIG. 1.

FIG. 2A shows an example of a transceiver 220 having a transmitter 230 and a receiver 250. In general, the conditioning of the signals in the transmitter 230 and the receiver 250 may be performed by one or more stages of amplifier, filter, upconverter, downconverter, etc. These circuit blocks may be arranged differently from the configuration shown in FIG. 2A. Furthermore, other circuit blocks not shown in FIG. 2A may also be used to condition the signals in the transmitter 230 and receiver 250. Unless otherwise noted, any signal in FIG. 2A, or any other figure in the drawings, may be either single-ended or differential. Some circuit blocks in FIG. 2A may also be omitted.

In the example shown in FIG. 2A, wireless device 200 generally comprises the transceiver 220 and a data processor 210. The data processor 210 may include a processor 296 operatively coupled to a memory 298. The memory 298 may be configured to store data and program codes shown generally using reference numeral 299, and may generally comprise analog and/or digital processing components. The processor 296 can be any control or computing circuitry. The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

In the transmit path, the data processor 210 processes data to be transmitted and provides in-phase (I) and quadrature (Q) analog output signals to the transmitter 230. In some aspects, the data processor 210 includes digital-to-analog-converters (DAC's) 214a and 214b for converting digital signals generated by the data processor 210 into the I and Q analog output signals, e.g., I and Q output currents, for further processing. In other embodiments, the DACs 214a and 214b are included in the transceiver 220 and the data processor 210 provides data (e.g., for I and Q) to the transceiver 220 digitally.

Within the transmitter 230, baseband (e.g., lowpass) filters 232a and 232b filter the I and Q analog transmit signals, respectively, to remove undesired images caused by the prior digital-to-analog conversion. Amplifiers (Amp) 234a and 234b amplify the signals from baseband filters 232a and 232b, respectively, and provide I and Q baseband signals. An upconverter 240 having upconversion mixers 241a and 241b upconverts the I and Q baseband signals with I and Q transmit (TX) local oscillator (LO) signals from a TX LO signal generator 290 and provides an upconverted signal. The received RF signal is amplified by LNA 252 and filtered by a filter to obtain a desired RF input signal. Downconversion mixers 261a and 261b in a downconverter 260 mix the output of filter with I and Q receive (RX) LO signals (i.e., LO_I and LO_Q) from an RX LO signal generator 280 to generate I and Q baseband signals. The I and Q baseband signals are amplified by amplifiers 262a and 262b and further filtered by baseband (e.g., lowpass) filters 264a and 264b to obtain I and Q analog input signals, which are provided to data processor 210. In the exemplary embodiment shown, the data processor 210 includes analog-to-digital-converters (ADC's) 216a and 216b for converting the analog input signals into digital signals to be further processed by the data processor 210. In some embodiments, the ADCs 216a and 216b are included in the transceiver 220 and provide data to the data processor 210 digitally.

In FIG. 2A, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

In some aspects, the RX PLL 282, the TX PLL 292, the RX LO signal generator 280, and the TX LO signal generator 290 may alternatively be combined into a single LO generator circuit 295, which may include common or shared LO signal generator circuitry to provide the TX LO signals and the RX LO signals. Alternatively, separate LO generator circuits may be used to generate the TX LO signals and the RX LO signals.

Wireless device 200 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain components of the transceiver 220 are functionally illustrated in FIG. 2A, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules, chips, and/or components.

The wireless device 200 of FIG. 2A is an example of a heterodyne (or superheterodyne) architecture in which the upconverter 240 and the downconverter 260 are configured to process a communication signal between baseband and an intermediate frequency (IF). For example, the upconverter 240 may be configured to provide an IF signal to an upconverter 275. In some aspects, the upconverter 275 may comprise summing function 278 and upconversion mixer 276. The summing function 278 combines the I and the Q outputs of the upconverter 240 and provides a non-quadrature signal to the mixer 276. The non-quadrature signal may be single ended or differential. The mixer 276 is configured to receive the IF signal from the upconverter 240 and TX RF LO signals from a TX RF LO signal generator 277, and provide an upconverted RF signal to phase shift circuitry 281. While PLL 292 is illustrated in FIG. 2A as being shared by the signal generators 290, 277, a respective PLL for each signal generator may be implemented.

In some aspects, components in the phase shift circuitry 281 may comprise one or more adjustable or variable phased array elements, and may receive one or more control signals from the data processor 210 over a connection and operate the adjustable or variable phased array elements based on the received control signals.

In some aspects, the phase shift circuitry 281 comprises phase shifters 283 and phased array elements 287. Although three phase shifters 283 and three phased array elements 287 are shown for ease of illustration, the phase shift circuitry 281 may comprise more or fewer phase shifters 283 and phased array elements 287.

Each phase shifter 283 may be configured to receive the RF transmit signal from the upconverter 275, alter the phase by an amount, and provide the RF signal to a respective phased array element 287. Each phased array element 287 may comprise transmit and receive circuitry including one or more filters, amplifiers, driver amplifiers, and power amplifiers. In some embodiments, the phase shifters 283 may be incorporated within respective phased array elements 287. As described herein, compact low-loss reflective type phase shifters (e.g., as described in FIGS. 5-9 below) can each support both transmit and receive circuitry due to the bi-directional nature of the reflective type phase shifter, as well as multiple paths using switching circuitry or other such circuitry in various implementations.

The output of the phase shift circuitry 281 is provided to an antenna array 248. In some aspects, the antenna array 248 comprises a number of antennas that typically correspond to the number of phase shifters 283 and phased array elements 287, for example such that each antenna element is coupled to a respective phased array element 287. In some aspects, the phase shift circuitry 281 and the antenna array 248 may be referred to as a phased array.

In a receive direction, an output of the phase shift circuitry 281 is provided to a downconverter 285. In some aspects, the downconverter 285 may comprise an I/Q generation function 291 and a downconversion mixer 286. In some aspects, the mixer 286 downconverts the receive RF signal provided by the phase shift circuitry 281 to an IF signal according to RX RF LO signals provided by an RX RF LO signal generator 279. The I/Q generation function 291 receives the IF signal from the mixer 286 and generates I and Q signals for the downconverter 260, which downconverts the IF signals to baseband, as described above. While PLL 282 is illustrated in FIG. 2A as being shared by the signal generators 280, 279, a respective PLL for each signal generator may be implemented.

In some embodiments, the upconverter 275, downconverter 285, and the phase shift circuitry 281 are implemented on a common IC. In some embodiments, the summing function 278 and the I/Q generation function 291 are implemented separate from the mixers 276 and 286 such that the mixers 276, 286 and the phase shift circuitry 281 are implemented on the common IC, but the summing function 278 and I/Q generation function 291 are not (e.g., the summing function 278 and I/Q generation function 291 are implemented in another IC coupled to the IC having the mixers 276, 286). In some embodiments, the LO signal generators 277, 279 are included in the common IC. In some embodiments in which phase shift circuitry is implemented on a common IC with 276, 286, 277, 278, 279, and/or 291, the common IC and the antenna array 248 are included in a module, which may be coupled to other components of the transceiver 220 via a connector. In some embodiments, the phase shift circuitry 281, for example, a chip on which the phase shift circuitry 281 is implemented, is coupled to the antenna array 248 by an interconnect. For example, components of the antenna array 248 may be implemented on a substrate and coupled to an integrated circuit implementing the phase shift circuitry 281 via a flexible printed circuit.

Figure 2B:
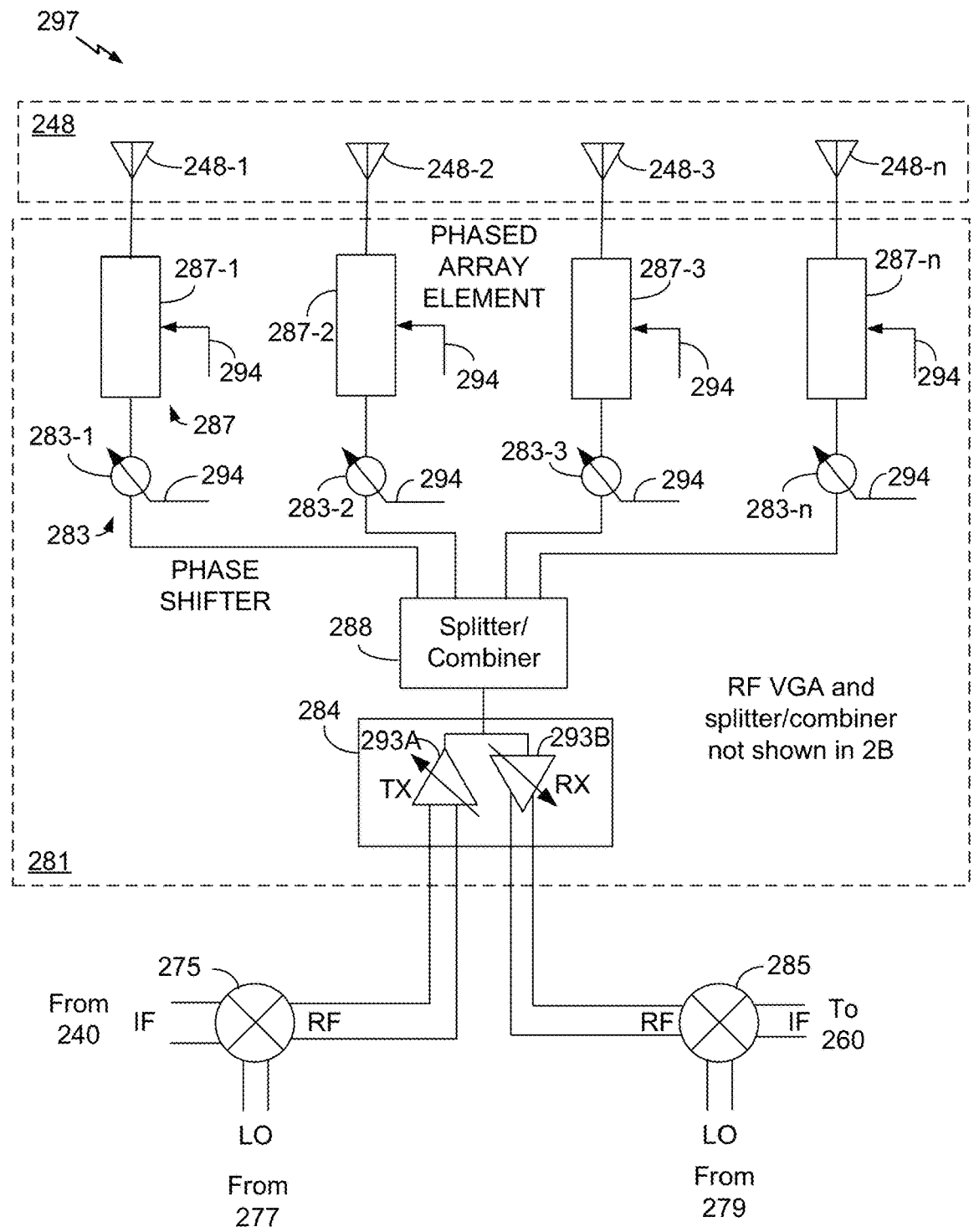
FIG. 2B is a block diagram illustrating aspects of a wireless device in accordance with some implementations described herein.

FIG. 2B is a block diagram 297 showing in greater detail an embodiment of some of the components of FIG. 2A. In some aspects, the upconverter 275 provides an RF transmit signal to the phase shift circuitry 281 and the downconverter 285 receives an RF receive signal from the phase shift circuitry 281. In some aspects, the phase shift circuitry 281 comprises an RF variable gain amplifier (VGA) 284, a splitter/combiner 288, the phase shifters 283 and the phased array elements 287. In some aspects, the phase shift circuitry 281 may be implemented on a millimeter-wave integrated circuit (mmWIC). In some such embodiments, the upconverter 275 and/or the downconverter 285 (or just the mixers 276, 286) are also implemented on the mmWIC. In some aspects, the RF VGA 284 may comprise a TX VGA 293A and an RX VGA 293B. In some embodiments, the TX VGA 293A and the RX VGA 293B may be implemented independently. In other embodiments, the VGA 284 is bidirectional. In some aspects, the splitter/combiner 288 may be an example of a power distribution network and a power combining network. In some embodiments, the splitter/combiner 288 may be implemented as a single component or as a separate signal splitter and signal combiner. The phase shifters 283 are coupled to respective phased array elements 287. Each respective phased array element 287 is coupled to a respective antenna element in the antenna array 248. In some aspects, phase shifters 283 and the phased array elements 287 receive control signals from the data processor 210 over a connection 294. The exemplary embodiment shown in FIG. 2B comprises a 1×4 array having four phase shifters 283-1, 283-2, 283-3 and 283-n, four phased array elements 287-1, 287-2, 287-3 and 287-n, and four antennas 248-1, 248-2, 248-3 and 248-n. However, a 1×4 phased array is shown for example only, and other configurations, such as 1×2, 1×6, 1×8, 2×3, 2×4, or other configurations are possible.

Figure 3:
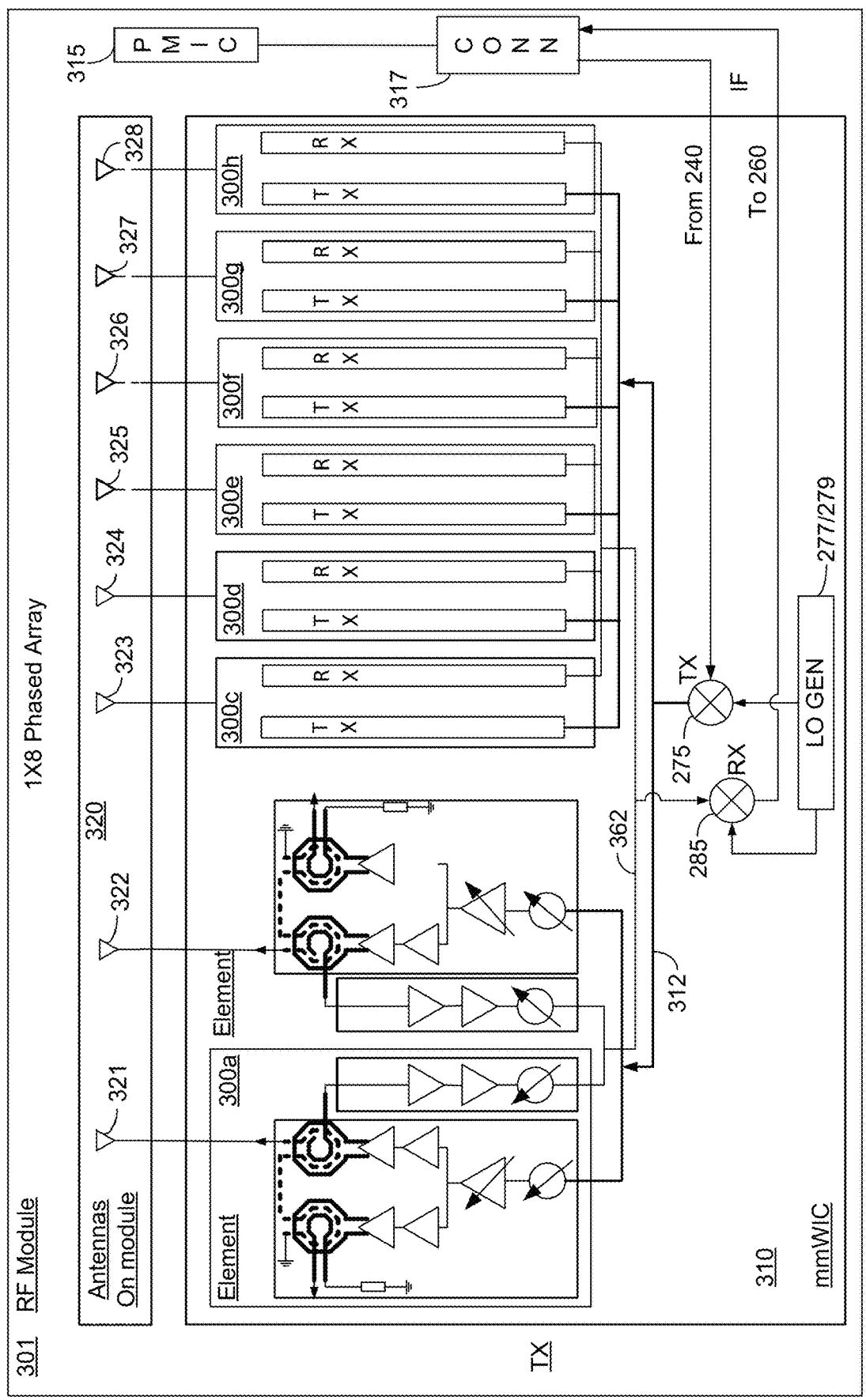
FIG. 3 is a block diagram of a millimeter wave (mmW) module illustrating a 1×8 phased array in accordance with aspects of the disclosure.

FIG. 3 is a block diagram of a millimeter wave (mmW) RF module 301 having a 1×8 phased array in accordance with some aspects of the disclosure. Although the RF module 301 is illustrated and described as including a 1×8 phased array, other array configurations for the RF module 301 are possible. As used herein, the terms "module" and "RF module" refer to a hardware configuration that incorporates some or all of the RF components on a single substrate or structure, for example such that all components are included in a common package.

In some aspects, the RF module 301 may comprise a millimeter wave integrated circuit (mmWIC) 310 (also referred to as a radio frequency integrated circuit (RFIC)), an antenna array 320, a power management integrated circuit (PMIC) 315, and a connector 317.

In some aspects, the mmWIC 310 may include a plurality of phased array elements, such as the phased array elements 300. In the 1×8 phased array example shown in FIG. 3, there are eight (8) phased array elements 300a, 300b, 300c, 300d, 300e, 300f, 300g and 300h. In some embodiments, the mmWIC 310 is coupled to a substrate and one or more of the antennas 321-328 are implemented on a surface and/or on one or more internal layers of the substrate in the RF module 301.

The phased array elements 300a-h are examples of single elements that may be implemented in a phased array on a millimeter wave integrated circuit (mmWIC). The phased array elements 300 may be an example of any of the phased array elements 287 from FIGS. 2A, 2B.

In some aspects, each phased array element 300 may comprise a transmit portion and a receive portion. In some aspects, the transmit portion may comprise a phase shifter (e.g., which can be shared with a receive portion), a variable gain amplifier, a variable capacitance, one or more amplifier paths, and a magnetic circuit.

The phase shifter may receive a transmit signal from a signal splitter, such as the splitter/combiner 288 of FIG. 2B. In some aspects, the signal may be a radio frequency (RF) signal provided by a mixer circuit. In some aspects, the phase shifter may receive a control signal over a connection that controls the phase of the transmit signal provided over a connection to the VGA. In some aspects, the phase shifter changes the phase of the signal on a connection by an amount that may be between 0 degrees and 360 degrees based on the control signal provided.

The variable gain amplifier may comprise one or more stages. For example, at millimeter wave frequencies, multiple stages of a VGA may be used to generate the desired gain control and power control. In some aspects, the VGA may receive a control signal over a connection that controls the gain and power of the transmit signal provided to the amplifier paths. In some aspects, the amplifier path may comprise a driver amplifier and a power amplifier.

In some aspects, a receive portion may comprise a low noise amplifier (LNA), which in some aspects may be a two-stage LNA. An output of the LNA may be provided to a phase shifter. The phase shifter may provide a receive signal over connection to a signal combiner, such as the splitter/combiner 288 of FIG. 2B. In some aspects, the signal on connection may be an RF signal provided to a mixer circuit. In some aspects, the phase shifter may receive a control signal over a connection that controls the phase of the receive signal. Given the number of Tx and Rx paths, sharing elements between the Tx and Rx paths can provide significant value by reducing device space and reducing the number of components in the combined Tx and Rx paths, since each element is re-used by each element in the phase array system. Phase shifter elements in particular form a large portion of front-end systems and may occupy additional space if the number of antennas increase (e.g., when a size of the antennas decreases, for example due to increasing frequencies of communication). Sharing a phase shifter between Tx and Rx paths, with super linearity and also limiting chip area use, provides device benefits by aligning Tx and Rx phase offsets as well as improving phase array reciprocity, which is a high value parameter for communication devices to improve field performance.

In some aspects, the mmWIC 310 may include the local oscillator (LO) signal generator 277 and 279 (FIG. 2A), the upconverter 275 and the downconverter 285. The upconverter 275 may be coupled to a signal connection 312, which may be coupled to the splitter/combiner 288 (FIG. 2B), and the downconverter 285 may be coupled to a signal connection 362, which may also be coupled to the splitter/combiner 288 (FIG. B) or to another combiner. In some aspects in a super-heterodyne architecture, the upconverter 275 may be configured to receive an output of the upconverter 240 (FIG. 2A) and the downconverter 285 may be configured to provide an output to the downconverter 260 (FIG. 2A).

In some aspects, the phased array elements 300a through 300h are similar to the phased array elements described above. Further, the phased array element 300b may be similar to the phased array element 300a, or may be a "mirror image" of the phased array element 300a. The phased array elements 300c, 300e and 300g may be similar to the phased array element 300a; and the phased array elements 300d, 300f and 300h may be similar to the phased array element 300b. Details of the phased array elements 300c, 300d, 300e, 300f, 300g and 300h are omitted for clarity of illustration.

In some aspects, the phased array element 300a provides an output to an antenna 321 and the phased array element 300b provides an output to an antenna 322. Similarly, the phased array element 300c provides an output to an antenna 323 and the phased array element 300d provides an output to an antenna 324; the phased array element 300e provides an output to an antenna 325 and the phased array element 300f provides an output to an antenna 326; and the phased array element 300g provides an output to an antenna 327 and the phased array element 300h provides an output to an antenna 328.

In some aspects, the PMIC module 315 provides and controls the power used by the components on the RF module 301 and the connector 317 couples the RF module 301 to other components in a communication device.

Other modules are possible in other aspects, such as 1×4 arrays, 1×16 arrays, 2×4 arrays, or other configurations. In some of these embodiments, the mmWIC may include all of the components which are included in the mmWIC 310, but the two mmWICs may be configured differently (for example, certain connections may be set differently).

The configurations shown in FIG. 3 and described above are examples only. Further all of these components may be included in a device without being packaged in a module. For example, the phased array elements could be coupled to a separate substrate on which the antennas are implemented instead of being coupled together with the antennas in a module.

In some embodiments, regardless of how many paths are implemented in each phased array element, only a single phase shifter may be used. In some aspects, each TRx pair is associated with a shared phase shifter.

Figure 4:
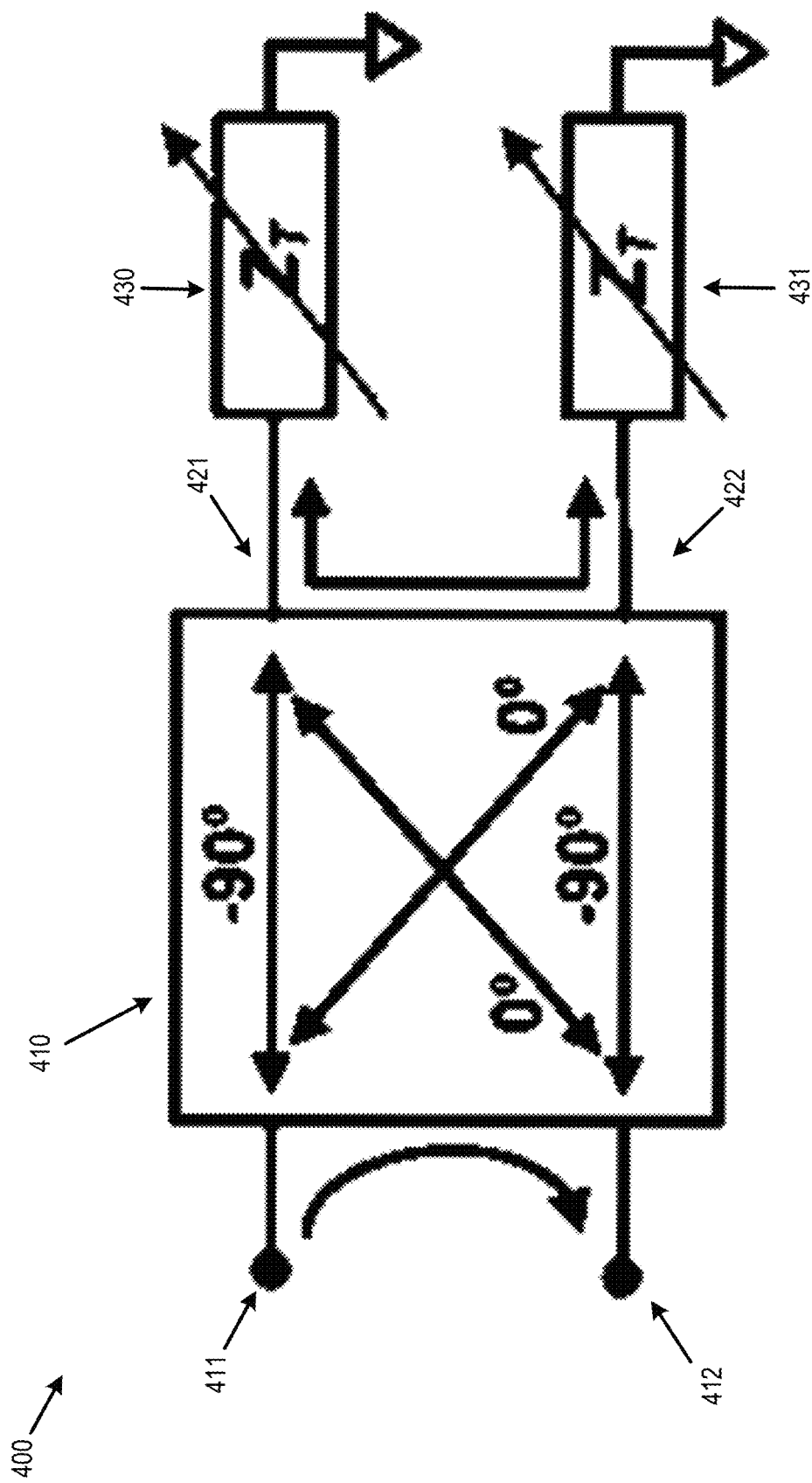
FIG. 4 is a diagram illustrating aspects of a reflection type phase shifter in accordance with embodiments described herein.

FIG. 4 is a diagram illustrating aspects of a reflection type phase shifter 400 in accordance with embodiments described herein. The reflection type phase shifter 400 includes a coupler 410 (e.g., a 90-degree coupler), along with variable load terminations 430 and 431 coupled to the 90-degree coupler 410. The variable load terminations 430 and 431 comprise a plurality of variable capacitive elements and a plurality of inductive elements. Specific example implementations of such terminations are discussed below (e.g., in FIGS. 5-9). When an input signal is received at terminal 411, the signal is split into two components (of equal power) that are output at terminals 421 and 422 with a 90-degree phase difference. The signal at terminals 421 and 422 are reflected according to the values of the load terminations 430 and 431. The reflection associated with the load terminations 430 and 431 is further associated with a phase shift that can be adjusted by tuning the values of the load terminations 430 and 431. The reflected signals then return from variable load terminations 430 and 431 to coupler 410, where they are combined coherently and output at terminal 412.

As described above, in accordance with aspects described herein, the illustrated reflection type phase shifters are bi-directional, so an input signal at terminal 412 can provide a phase shifted signal at terminal 411 using a similar mechanism described above for the opposite path.

Such a phase shifter offers improved linearity, bandwidth, and power consumption characteristics compared with certain other phase shifters, such as certain vector modulator-based phase shifters, which use DC power. Some passive reflection type and switch type phase shifters, however, may include higher insertion loss and larger integrated circuit areas. By efficiently structuring the variable load terminations 431 and 430, aspects described herein improve on prior passive phase shift devices with a compact structure and improved insertion loss, particularly in frequency ranges associated with 5G communication systems and 5G front end elements. Compared to other active vector-modulated phase shifter architecture, aspects described herein provide a phase shifter offering bi-directional operation capability, where the signal at 411,412 can be configured for different Tx/Rx modes. Due to the challenges of mmW phase array floorplan design and physical routing limitation, such bi-directional operation capability results in improved devices with shared elements between Tx and Rx paths where an overall chip area can be reduced.

Figure 5:
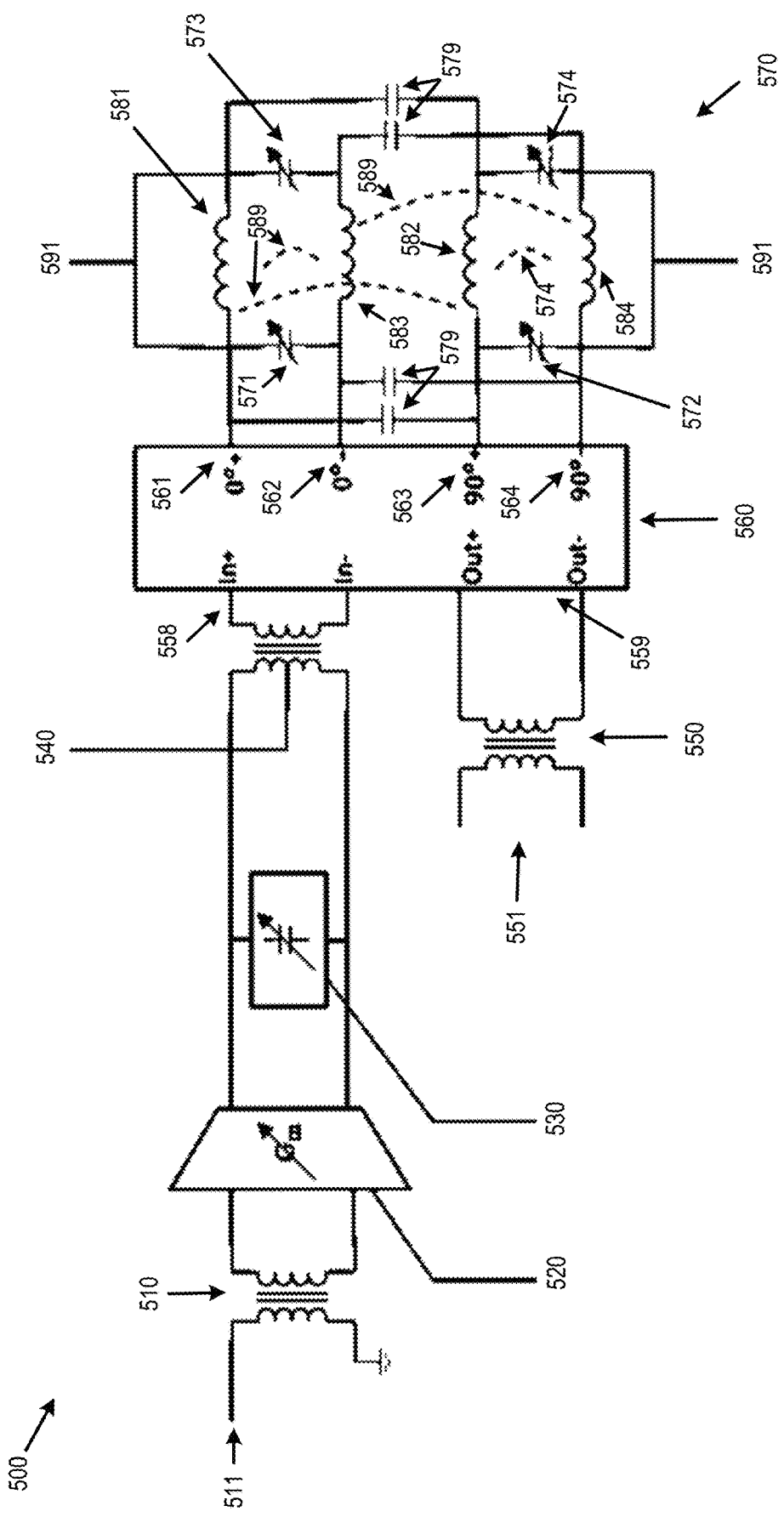
FIG. 5 is a diagram illustrating aspects of a reflection type phase shifter in accordance with embodiments described herein.

FIG. 5 is a diagram illustrating aspects of an apparatus 500 including a reflection type phase shifter 570 in accordance with embodiments described herein. In some examples, the phase shifter 570 is an example of one (or any) or the phase shifters 283. The apparatus 500 includes both a variable gain amplifier section that can be used to calibrate amplitude and phase characteristics of a signal, as well as the phase shifter 570. The variable gain amplifier includes a first transformer 510 that receives a single-ended signal (e.g., from the mixer 275 or splitter 288) and converts the signal at connection 511 to a differential signal. The output differential signal from the first transformer 510 is provided to a gain control element 520. The gain control element 520 can be used to calibrate the differential signal amplitude for the phase shifter 570, and can be set using digital control signals received from control circuitry coupled to apparatus 500. The phase calibration element 530 can be a capacitive element or any other such element used to calibrate the differential input signal for the phase shifter 570. Just as with gain control element 520, the phase calibration element can be adjusted using a control signal from control circuitry coupled to apparatus 500. The differential signal then passes a second transformer 540 and is provided to input 558 of the 90-degree coupler 560. For bi-directional operation, the output 559 of the 90 degree coupler 560 coupled to transformer 550 can be connected via connection 551 to a variable gain amplifier structure that mirrors the above structure, with amplitude and gain control elements for a reverse path input via transformer 550 that is not shown. In such an implementation, switching circuitry or other such circuit elements can be used to manage the signal output from the 90 degree coupler 560 input 558 when a signal is input to output 559.

When a signal is input to 90 degree coupler 560 (either via input 558 or output 559 depending on the bi-direction operation being used), the input differential signal is split into two signals of approximately equivalent amplitude, having a 90 degree phase shift. The first signal is output as a differential signal at a first reflection signal terminal 561 and a second reflection signal terminal 562. A second signal is output as a second differential signal at a third reflection signal terminal 563 and a fourth reflection signal terminal 564 of 90 degree coupler 560. The first signal and the second signal are configured with a phase 90 degrees offset from each other by 90 degree coupler 560. As described above, the two output signals are reflected by the described variable load terminations of the phase shifter 570.

The particular implementation of variable load terminations in FIG. 5 (e.g., which can be an implementation of variable load terminations 430 and 431 in accordance with aspects described herein) include a first variable capacitive element 571 coupled from the first reflection signal terminal 561 to the second reflection signal terminal 562. A second variable capacitive element 572 is coupled from the third reflection signal terminal 563 to the fourth reflection signal terminal 564. A first inductive element 581 having a first end and a second end has the first end of the first inductive element 581 coupled to the first reflection signal terminal 561. A second inductive element 582 has a first end coupled to the second end of the first inductive element 581, and a second end coupled to the third reflection signal terminal 563. A third inductive element 583 has a first end and a second end, with the first end of the third inductive element 583 coupled to the second reflection signal terminal 562. A fourth inductive element 584 has a first end coupled to the second end of the third inductive element 583, and a second end coupled to the fourth reflection signal terminal 564. A third variable capacitive element 573 is coupled from the second end of the first inductive element 581 (e.g., which is also the second end of the second inductive element 582, with capacitive coupling 579 shown between in the diagram of FIG. 5) to the first end of the third inductive element 583. A fourth variable capacitive element 574 is coupled from the second end of the second inductive element 582 to the first end of the fourth inductive element 584.

Control signals 591 are connected to the four variable capacitive elements 571, 572, 573, and 574. The control lines are indicated as attached at connection points with inductive elements, but are implemented to avoid impacting the signal. The control signals can be coupled to control circuitry that is used to set the phase shift generated at the output of 90 degree coupler 560. For example, adjusting one or more of the variable capacitive elements 571, 572, 573, and 574 may adjust a phase shift provided by the phase shifter 570.

In addition to the connections described above and illustrated in FIG. 5, the capacitive couplings 579 and the magnetic coupling 589 is an integral part of the performance of phase shifter 570. The capacitive coupling 579 shown in FIG. 5 are not elements of a physical circuit, but are present due to the positioning of the variable capacitive elements described above. In the physical structure implementing the apparatus 500, the first variable capacitive element 571, the second variable capacitive element 572, the third variable capacitive element 573, and the fourth variable capacitive element 574 are positioned and fabricated in to create the capacitive coupling 579. The illustration of FIG. 5 shows the electrical impact of the capacitive coupling 579 due to the element positioning. The capacitive coupling is part of the apparatus 500 design to create a compact phase shifter with low insertion loss. In some examples, the electromagnet coupling 579 can have a value of approximately 40 femtofarads (fF) when the capacitive values of the variable capacitive elements 571-574 are in a range between approximately 50 and 150 femtofarads (fF). In some aspects, the capacitive coupling can be configured in a range within the variable (e.g., tunable) range of the elements of the phase shifter 570. In other examples, other ranges can be used depending on the application and characteristics of a device using the apparatus 500 or phase shifter 570.

Similar to the capacitive coupling 579, inductive elements 581-584 are similarly positioned and fabricated to create magnetic coupling 589. Just as with capacitive coupling 579, magnetic coupling is part of the apparatus 500 design to create a compact phase shifter with low insertion loss. In some aspects, the first inductive element 581, the second inductive element 582, the third inductive element 583, and the fourth inductive element 584 are configured (e.g., positioned, fabricated, etc.) to create a magnetic coupling having a moderate coupling coefficient value between approximately 0.3 and 0.5. In other aspects other ranges can be used depending on the application and characteristics of a device using the apparatus 500 or phase shifter 570.

Figure 6:
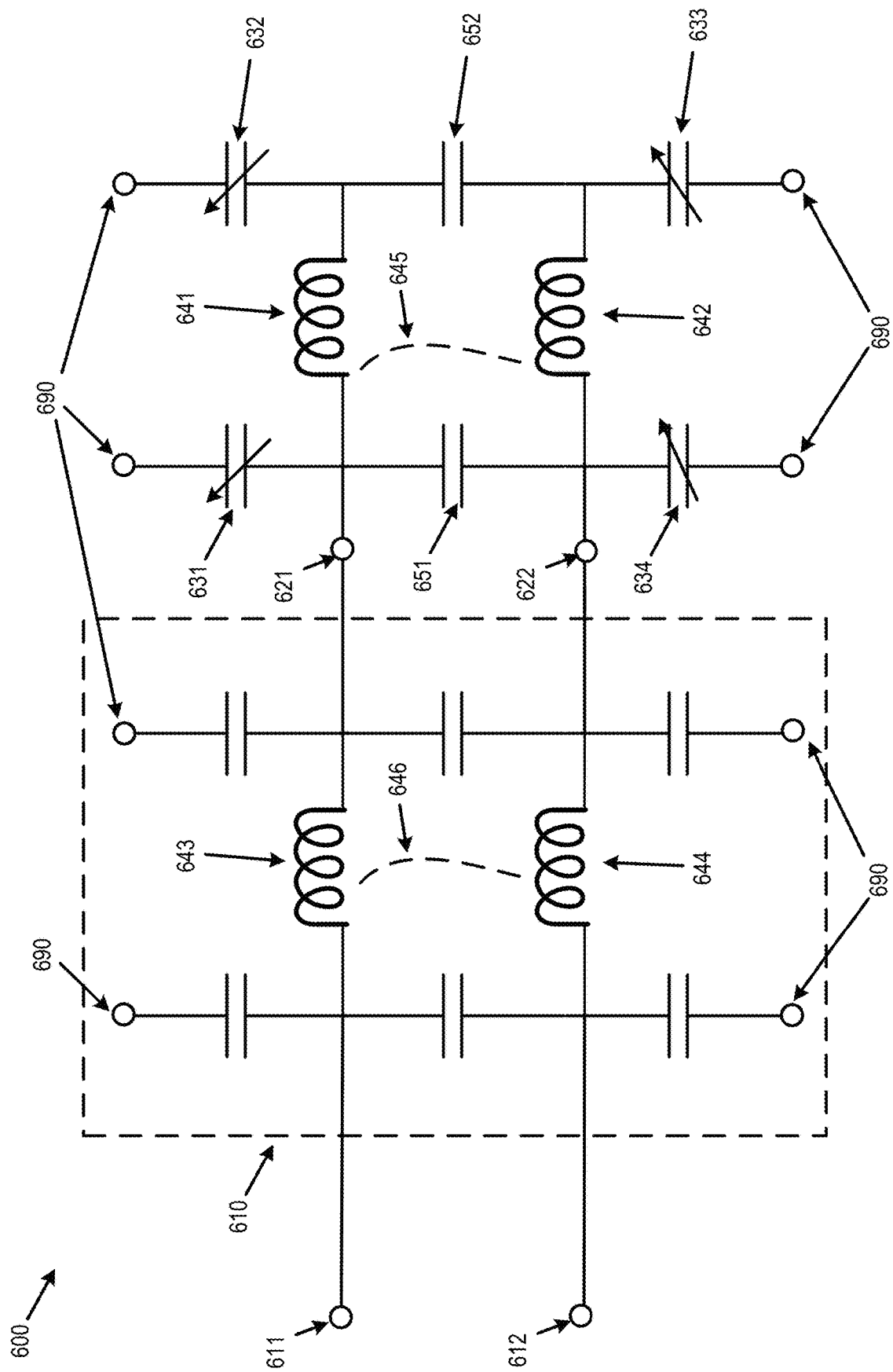
FIG. 6 is a diagram illustrating a reflection type phase shifter combined with an amplifier in accordance with aspects described herein.

FIG. 6 is a diagram illustrating a reflection type phase shifter 600 which can be combined with an amplifier in accordance with aspects described herein. The phase shifter 600 can be considered as a model of the phase shifter 570 of FIG. 5. The phase shifter 600 includes input 611, output 612, coupler 610 (e.g., modeled with capacitive and inductive elements), and a model for variable load terminations connected to the coupler 610.

In the aspects illustrated by FIG. 5, the coupler 610 receives a signal via input 611 or output 612, and outputs two equal amplitude versions of the signal phase shifted by 90 degrees at a first reflection signal terminal 621 a second reflection signal terminal 622. The variable load terminations are illustrated as a first inductive element 641 having a first end and a second end, where the first end is coupled to the first reflection signal terminal 621. A second inductive element 642 has a first end and a second end, with the second end coupled to the second reflection signal terminal 622. As shown, terminals 621 and 622 are connected to inductive elements 643 and 644, which are configured for magnetic (e.g., inductive) coupling 646. A first variable capacitive element 631 is coupled from the first reflection signal terminal 621 to a first reference terminal 690 (e.g., a ground potential). A second variable capacitive element 632 is coupled from the second end of the first inductive element 641 to a second reference terminal 690. A third variable capacitive element 633 is coupled from the first end of the second inductive element 642 to a third reference terminal 690. A fourth variable capacitive element 634 is coupled from the second reflection signal terminal to a fourth reference terminal 690. Just as described above, the elements are positioned and designed to integrate magnetic coupling 645 and capacitive coupling 651 and 652 into the operational design of the phase shifter 600. The design can include capacitive coupling in a range associated with a particular operation (e.g., 50-150 fF) and a magnetic coupling having a coupling value in a range for the operations (e.g., between 0.3 and 0.5). In some aspects, the signal can be modeled as follows, with an even mode represented as a signal output at the terminal 621 by:

$$Z_{Te} = \frac{1 + s^2 L_p(1+K_L)C_2}{s(C_1+C_2) + s^3 L_p(1+K_L)C_1 C_2} \quad (1)$$

where $$L_e = L_p(1+K_L) \quad (2)$$

$$\Gamma_e = \frac{A - jB}{A + jB} \quad (3)$$

$$A = 1 - \omega^2 L_p(1+K_L)C_2 \quad (4)$$

and $$B = Z_0 \omega \big((C_1 + C_2) - \omega^2 L_p(1+K_L)C_1 C_2\big) \quad (5)$$

An odd mode can be modeled as:

$$Z_{To} = \frac{1 + s^2 L_p(1-K_L)(C_2 + 2C_m)}{s(C_1+C_2+4C_m) + s^3 L_p(1-K_L)(C_1+2C_m)(C_2+2C_m)} \quad (6)$$

where $$L_o = L_p(1-K_L) \quad (7)$$

$$\Gamma_o = \frac{C - jD}{C + jD} \quad (8)$$

$$C = 1 - \omega^2 L_p(1-K_L)(C_2 + 2C_m) \quad (9)$$

and $$D = Z_0 \omega \big((C_1+C_2+4C_m) - \omega^2 L_p(1-K_L)(C_1+2C_m)(C_2+2C_m)\big) \quad (10)$$

The phase shifter can then be modeled using the above as:

$$\Gamma = \frac{1}{2}(\Gamma_e + \Gamma_o) = \frac{AC + BD}{AC - BD + j(AD + BC)} \quad (11)$$

and $$\angle \Gamma = -\tan^{-1} \frac{AD + BC}{AC - BD} \quad (12)$$

Figure 7A:
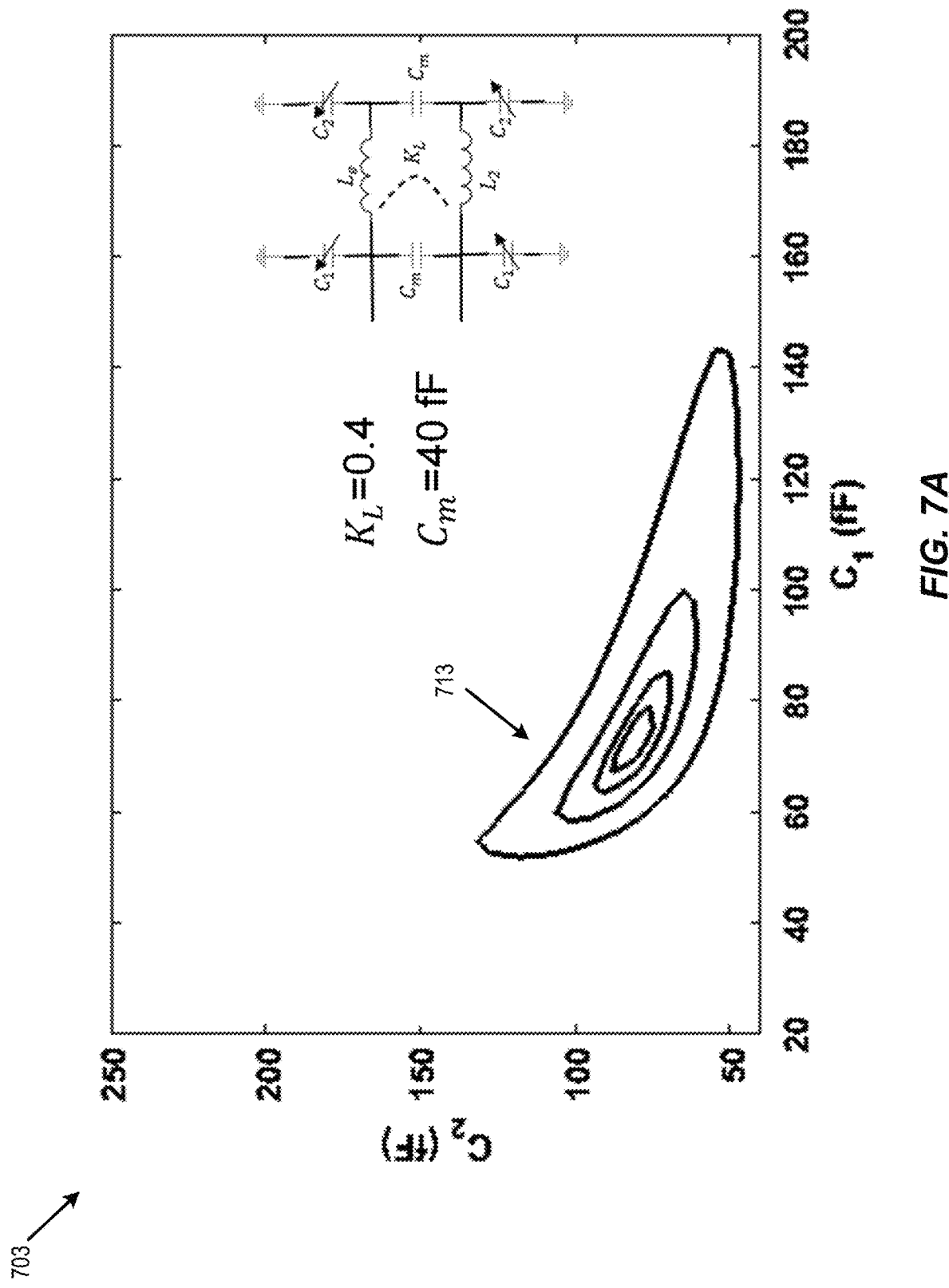
FIG. 7A is a graph illustrating aspects of phase shifter design in accordance with one implementation described herein.

FIG. 7A is a graph illustrating aspects of phase shifter design in accordance with one implementation described herein. FIG. 7A shows graph 703 with performance characteristics 713. As illustrated, adding an capacitive coupling (e.g., coupling 579) as shown by graph 703 with characteristics 713 to the configuration with a value of approximately 40 fF allows tuning of both C1 and C2 while providing improved insertion loss. Graph 703 illustrates how both magnetic coupling and capacitive coupling can improve coupler design range in accordance with various aspects described herein.

Figure 7B:
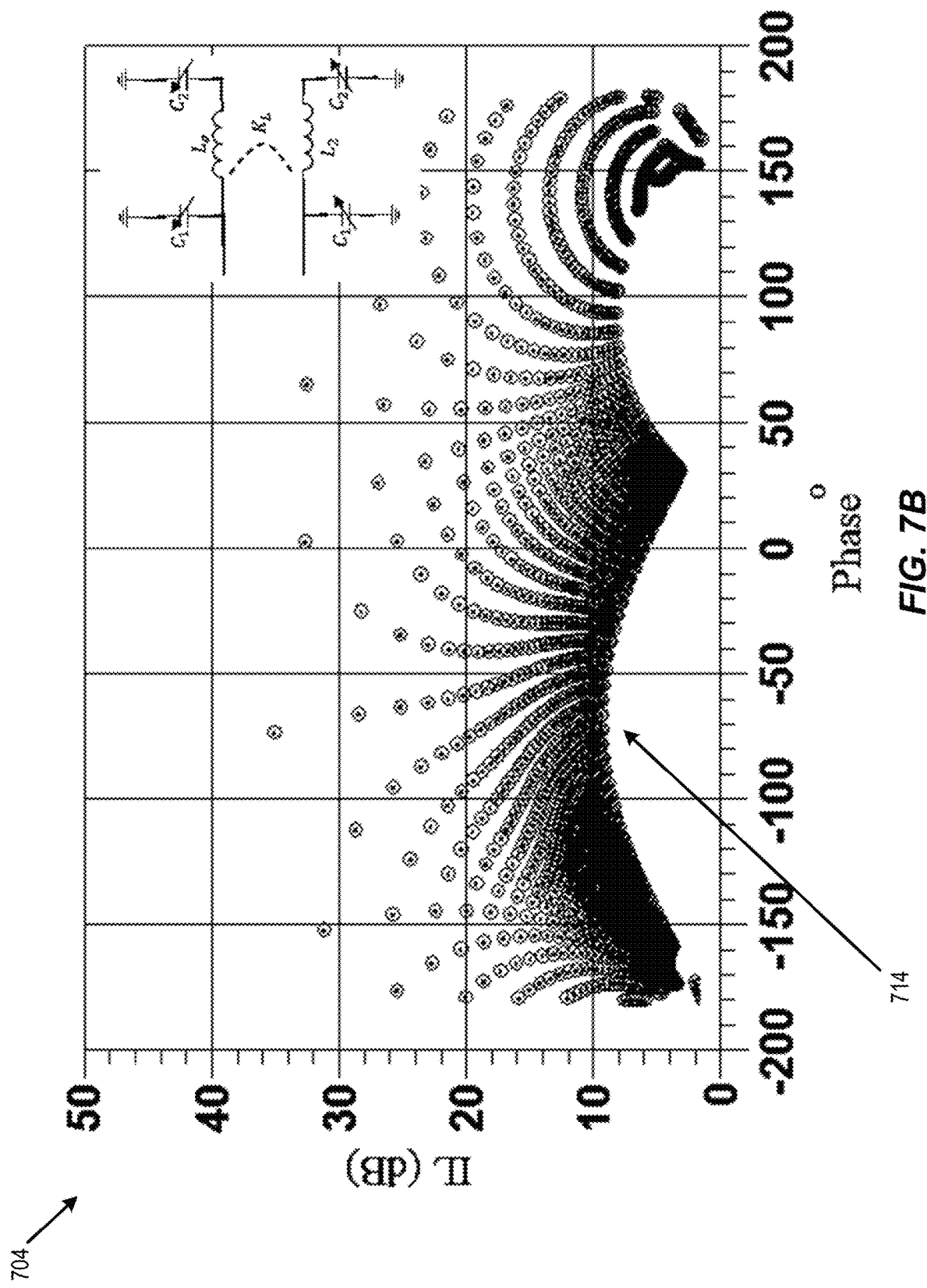
FIG. 7B is a graph illustrating aspects of phase shifter performance in accordance with one implementation described herein.
Figure 7C:
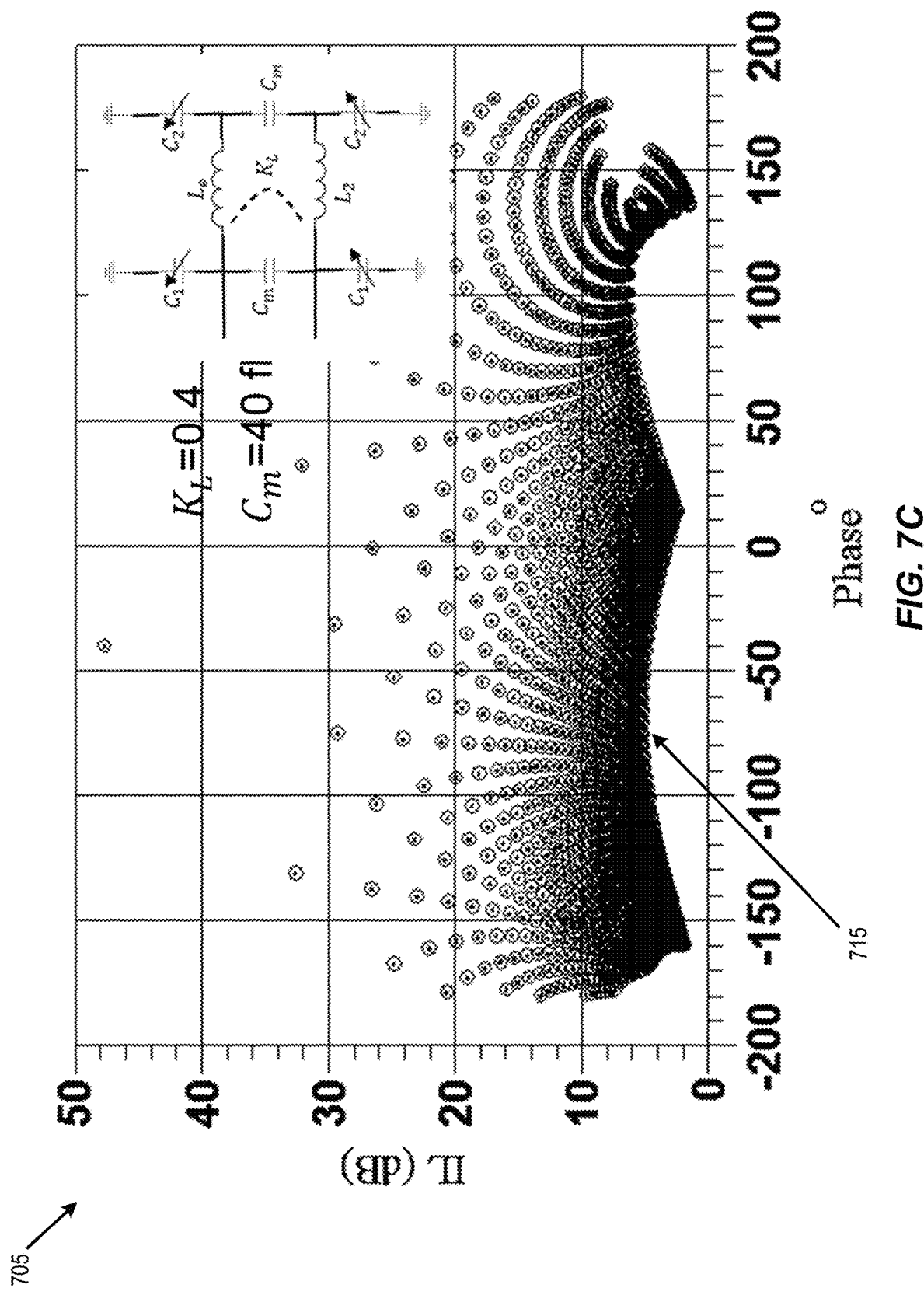
FIG. 7C is a graph illustrating aspects of phase shifter performance in accordance with one implementation described herein.

FIGS. 7B and 7C are graphs illustrating aspects of phase shifter performance in accordance with one implementation described herein. FIG. 7B and FIG. 7C illustrate the improved insertion loss performance associated with the device configuration of FIG. 7A including both capacitive coupling (e.g., coupling 579) and magnetic coupling (e.g., coupling 589). Graphs 704 and 705 both show insertion loss (IL) on the y-axis graphed against an output signal phase shift on the x-axis. The x-axis phase shift is achieved in a given phase shifter by adjusting the variable capacitance elements (e.g., elements 571-574) within ranges illustrated by graphs 701-703. Graph 704 illustrates a maximum insertion loss 714 of approximately 9 decibels (dB) and no capacitive coupling. Graph 705 illustrates an improved maximum insertion loss 715 of approximately 5 dB and capacitive coupling. The improved insertion loss performance is achieved via compact tunable element design that integrates both magnetic coupling and capacitive coupling together.

Figure 8:
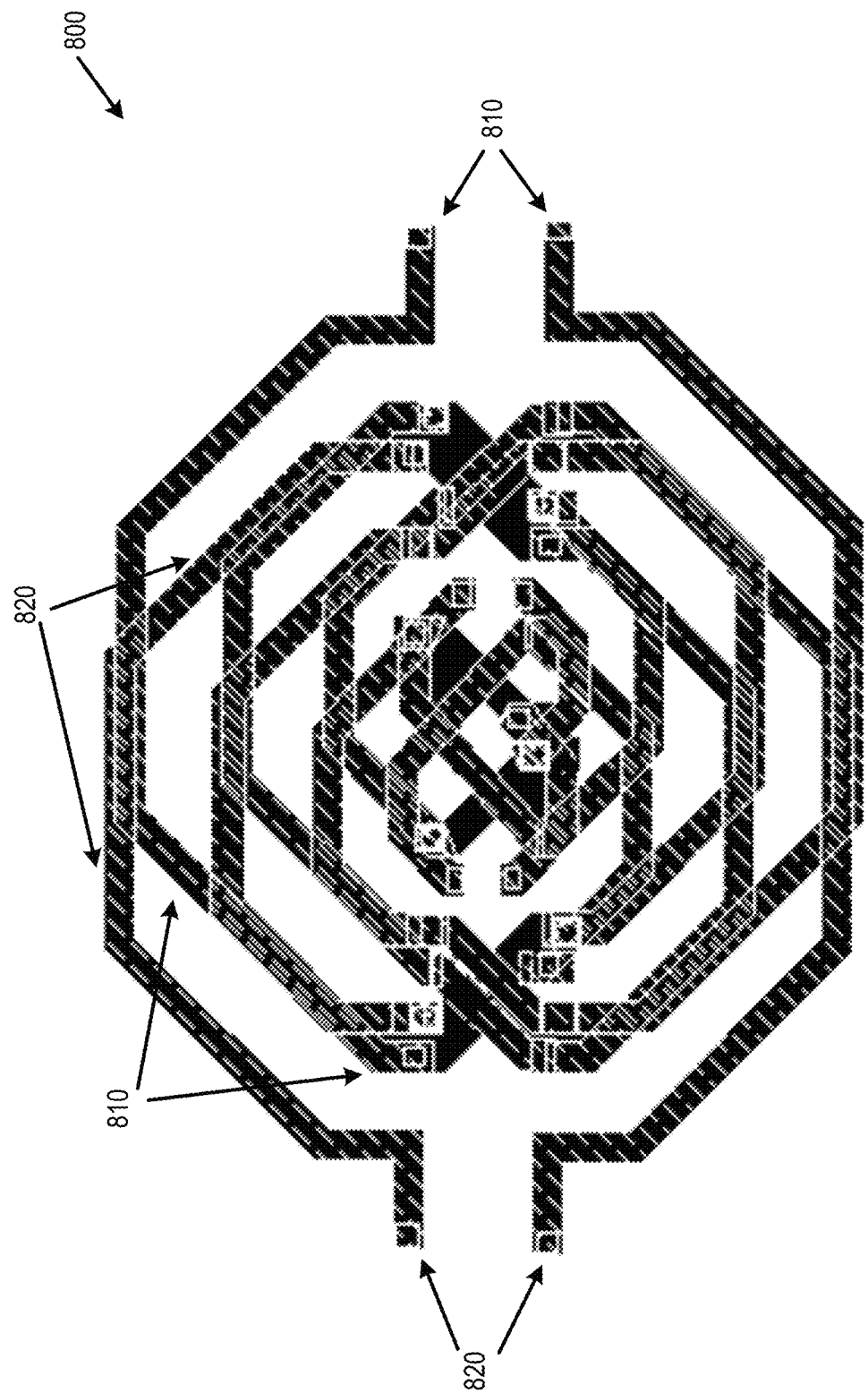
FIG. 8 is a diagram illustrating aspects of a reflection type phase shifter in accordance with embodiments described herein.

FIG. 8 is a diagram illustrating aspects of a reflection type phase shifter in accordance with embodiments described herein. The layout 800 of FIG. 8 can be implemented as a routing layout structure for variable load terminations in a reflection type phase shifter to achieve the improved insertion loss described above in a compact layout that limits area usage in an integrated circuit. In some aspects, mmW performance for layout 800 can be achieved with routing 810 on a first layer, and routing 820 on a second layer. The first layer routings can be coupled to terminals for one signal output from a 90 degree coupler in a phase shifter (e.g., terminals 561 and 562), and the second layer routings can be coupled to terminals for another signal output from the coupler (e.g., terminals 563 and 564). Thus, the routings 810 and 820 may be arranged in a configuration in which they are stacked or overlaid (e.g., at least partially overlapping). In some examples, the routings 810, 820 may be formed on more than two layers. The coupling values can be determined by the device fabrication characteristics, elements coupled to the routings 810 and 820, and the particular dimensions of layout 800. In various implementations, additional capacitive or inductive elements beyond what is illustrated in FIG. 8 may be present. In some implementations, other structures, such as differential quadrature hybrid structures can be configured for use with a reflection type phase shifter in accordance with aspects described herein. Such quadrature hybrid structures can be used in routing layout structures for variable load terminations in an apparatus implementing reflection type phase shifters to achieve the compact low loss performance described herein. Further, the type of hybrid structure may be different in different implementations. Other aspects can use different layouts for variable load termination structures in accordance with examples described herein. Some aspects can use single layer layouts with capacitive and inductive elements structured for both variable values and coupling to achieve compact low loss performance. Additional aspects can include other multi-layer structures besides those described above. In the various aspects, any such layout can be used that includes coupling sufficient to impact the phase shift and insertion loss performance.

Figure 9:
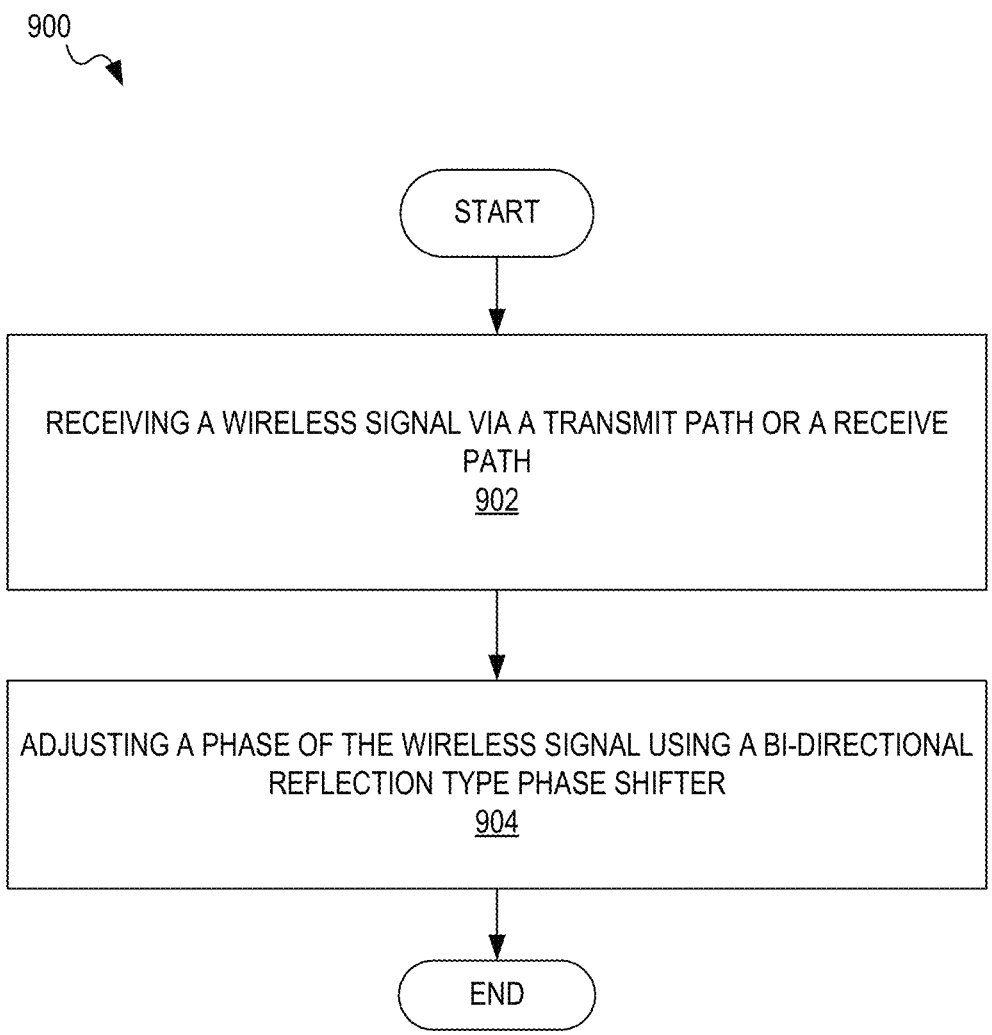
FIG. 9 is a flow diagram describing an example of the operation of a method for reflection type phase shifting in accordance with some aspects.

FIG. 9 is a flow diagram describing an example of the operation of a method for reflection type phase shifting in accordance with some aspects. The blocks in the method 900 can be performed in or out of the order shown, and in some embodiments, can be performed at least in part in parallel.

Method 900 includes block 902, which involves receiving a communication signal. The communication signal can be received at a bi-directional reflection type phase shifter from an antenna element (e.g., where the signal is received wirelessly at the antenna element and then propagated to the phase shifter) of a wireless apparatus as part of a receive path, or can be received from transmit circuitry as part of a transmit path.

Method 900 includes block 904, which involves adjusting a phase of the communication signal (e.g., that is either received wirelessly at the apparatus performing the method, or that is in a Tx path in preparation for wireless transmission by the apparatus) using a bi-directional reflection type phase shifter. As described herein, the bi-directional reflection type phase shifter can be shared by the transmit path and the receive path, and can adjust communication signal phase characteristics for both transmit and receive signals. In some aspects, the bi-directional reflection type phase shifter comprises a phase shifter, and variable load terminations coupled to the phase shifter, the variable load terminations comprising a plurality of variable capacitive elements and a plurality of inductive elements. In some aspects, the plurality of variable capacitive elements are positioned to create a moderate capacitive coupling sufficient to impact an insertion loss at an apparatus operating frequency. In some aspects, the plurality of inductive elements are positioned to create a magnetic coupling between the plurality of inductive elements sufficient to impact the insertion loss at the apparatus operating frequency. In some aspects, the phase shifter is a 90-degree phase shifter. In other aspects, the bi-directional reflection type phase shifter includes other structures described herein, and can operate in accordance with any of the operations described herein.

Figure 10:
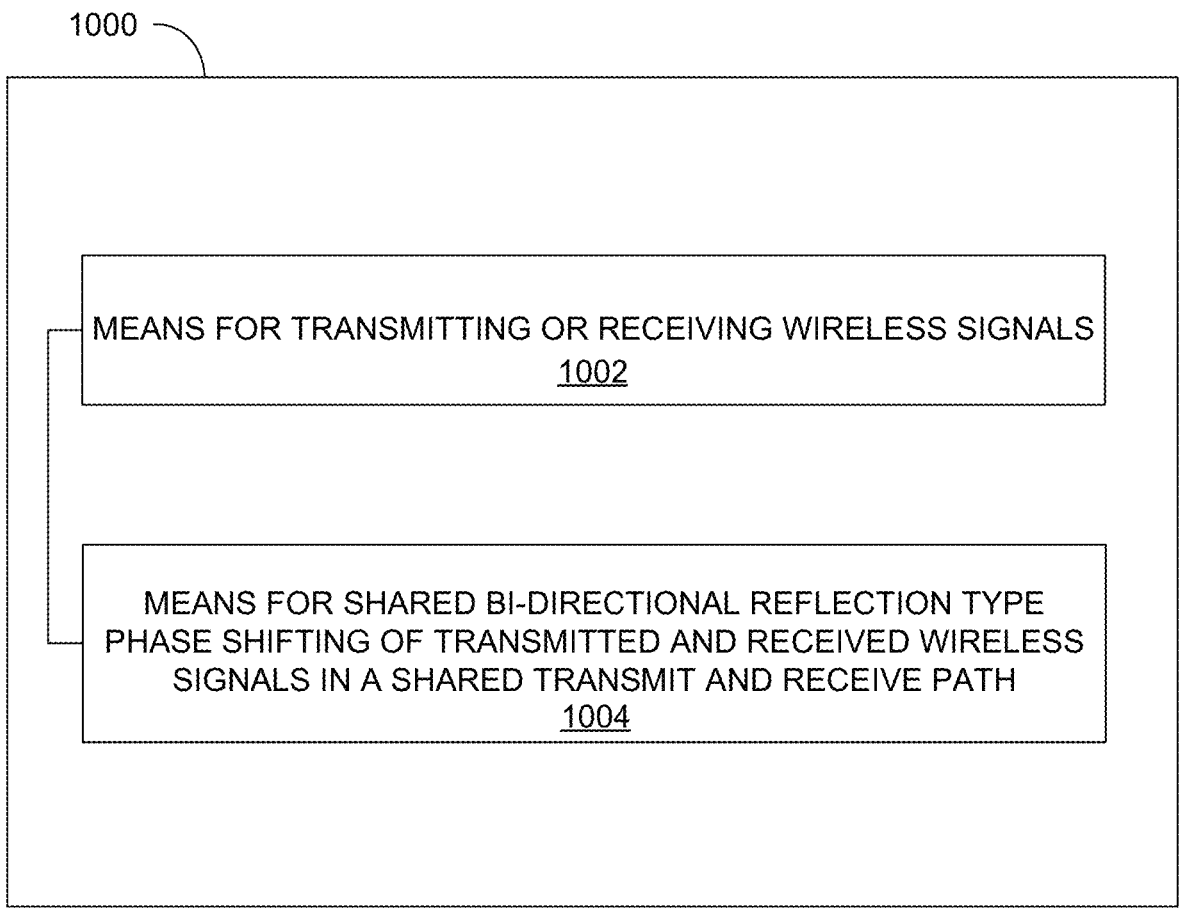
FIG. 10 is a functional block diagram of an apparatus for reflection type phase shifting in accordance with some aspects.

FIG. 10 is a functional block diagram of an apparatus for reflection type phase shifting in accordance with some aspects. The apparatus 1000 comprises means 1002 for transmitting or receiving communication signals, and means 1004 for shared bi-directional reflection type phase shifting of transmitted and received communication signals in a shared transmit and receive path. As described above, reflection type phase shifters can, when shared by transmit and receive circuitry for a single antenna element, improve a device by using significantly less space that designs with separate phase shifters. Bi-direction phase shifting means 1004, in accordance with aspects described herein, provide such device improvements, along with other improvements described above.

The circuit architecture described herein described herein may be implemented on one or more ICs, analog ICs, RFICs, mixed-signal ICs, ASICs, printed circuit boards (PCBs), electronic devices, etc. The circuit architecture described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

Although selected aspects have been illustrated and described in detail, it will be understood that various substitutions and alterations may be made therein without departing from the spirit and scope of the present invention, as defined by the following claims.

Aspects described herein include, but are not limited to:

Aspect 1: A wireless communication apparatus, comprising: a reflective coupler with a tuned termination comprising a first reflection signal terminal, a second reflection signal terminal, a third reflection signal terminal, and a fourth reflection signal terminal; a first variable capacitive element coupled from the first reflection signal terminal to the second reflection signal terminal; a second variable capacitive element coupled from the third reflection signal terminal to the fourth reflection signal terminal; a first inductive element having a first end and a second end, wherein the first end of the first inductive element is coupled to the first reflection signal terminal; a second inductive element having a first end coupled to the second end of the first inductive element, and a second end coupled to the third reflection signal terminal; a third inductive element having a first end and a second end, wherein the first end of the third inductive element is coupled to the second reflection signal terminal; a fourth inductive element having a first end coupled to the second end of the third inductive element, and a second end coupled to the fourth reflection signal terminal; a third variable capacitive element coupled from the second end of the first inductive element and the first end of the third inductive element; and a fourth variable capacitive element coupled from the second end of the second inductive element to the first end of the fourth inductive element.

Aspect 2: The wireless communication apparatus of aspect 1, wherein the first variable capacitive element, the second variable capacitive element, the third variable capacitive element, and the fourth variable capacitive element are positioned to create a moderate capacitive coupling.

Aspect 3: The wireless communication apparatus of any of aspects 1 through 2, wherein the first inductive element, the second inductive element, the third inductive element, and the fourth inductive element are positioned to create a moderate magnetic coupling.

Aspect 4: The wireless communication apparatus of aspect 3, wherein the moderate magnetic coupling results in a coupling value between inductive elements of between 0.3 and 0.5.

Aspect 5: The wireless communication apparatus of any of aspects 3 through 4, wherein the moderate capacitive coupling is approximately between 30 and 50 femtofarads (fF).

Aspect 6: The wireless communication apparatus of any of aspects 1 through 5, wherein the first variable capacitive element and the second variable capacitive element have a shared capacitive value.

Aspect 7: The wireless communication apparatus of aspect 6, wherein the shared capacitive value is tunable in a range from 60 fF to 140 fF.

Aspect 8: The wireless communication apparatus of any of aspects 1 through 7, further comprising control circuitry coupled to the first variable capacitive element, the second variable capacitive element, the third variable capacitive element, and the fourth variable capacitive element, wherein the control circuitry is configured to select capacitive values to set a phase shift value.

Aspect 9: The wireless communication apparatus of any of aspects 1 through 8 further comprising a phase shift component comprising a first phase shift input, a second phase shift input, the first reflection signal terminal, the second reflection signal terminal, the third reflection signal terminal, the fourth reflection signal terminal, a first phase shift output, and a second phase shift output.

Aspect 10: The wireless communication apparatus of aspect 9, further comprising a variable gain amplifier coupled to the phase shift component.

Aspect 11: The wireless communication apparatus of aspect 10, wherein the variable gain amplifier comprises a bi-directional single-ended input, a gain control, a phase calibration element, amplitude control circuitry, and a bi-directional single ended output.

Aspect 12: The wireless communication apparatus of any of aspects 10 through 11, further comprising a transmit path coupled to the variable gain amplifier.

Aspect 13: The wireless communication apparatus of any of aspects 1 through 12, wherein the wireless communication apparatus comprises a bi-directional reflection type phase shifter.

Aspect 14: The wireless communication apparatus of any of aspects 1 through 13, wherein the wireless communication apparatus comprises a phased array element.

Aspect 15: The wireless communication apparatus of aspect 14, the phased array element further comprising a transmit path and a receive path, wherein the transmit path comprises the bi-directional reflection type phase shifter, and wherein the receive path comprises the bi-directional reflection type phase shifter.

Aspect 16: The wireless communication apparatus of any of aspects 1 through 15, wherein the wireless communication apparatus comprises a millimeter wave integrated circuit (mmWIC).

Aspect 17: The wireless communication apparatus of aspect 16, wherein the mmWIC comprises a plurality of phased array elements, and wherein a first phased array element of the plurality of phased array elements comprises the first variable capacitive element, the second variable capacitive element, the third variable capacitive element, the fourth variable capacitive element, the first inductive element, the second inductive element, the third inductive element, and the fourth inductive element.

Aspect 18: The wireless communication apparatus of aspect 17, wherein each phased array element of the plurality of phased array elements comprises a bi-directional reflection type phase shifter.

Aspect 19: The wireless communication apparatus of any of aspects 3 through 6, wherein the moderate capacitive coupling and the moderate magnetic coupling are created using a coupled transformer layout for the first variable capacitive element, the second variable capacitive element, the third variable capacitive element, the fourth variable capacitive element, the first inductive element, the second inductive element, the third inductive element, and the fourth inductive element.

Aspect 20: The wireless communication apparatus of aspect 19, wherein the coupled transformer layout uses two layers of a millimeter wave integrated circuit (mmWIC) and a surface area of the mmWIC is approximately 95 micrometers (um) by 135 um.

Aspect 21: The wireless communication apparatus of any of aspects 3 through 6, wherein the moderate capacitive coupling and the moderate magnetic coupling are created using a differential quadrature hybrid layout for the first variable capacitive element, the second variable capacitive element, the third variable capacitive element, the fourth variable capacitive element, the first inductive element, the second inductive element, the third inductive element, and the fourth inductive element. Aspect 22: A wireless communication apparatus, comprising: a 90-degree differential reflective coupler with a tunable termination comprising a first reflection signal terminal, a second reflection signal terminal, a third reflection signal terminal, a fourth reflection signal terminal, a bi-directional differential input, and a bi-direction differential output; a first inductive element having a first end and a second end, wherein the first end is coupled to the first reflection signal terminal; a second inductive element having a first end and a second end, wherein the second end is coupled to the second reflection signal terminal; a third inductive element having a first end and a second end, wherein the first end is coupled to the third reflection signal terminal; a fourth inductive element having a first end and a second end, wherein the second end is coupled to the fourth reflection signal terminal; a first variable capacitive element coupled from the first reflection signal terminal to the second reflection signal terminal; a second variable capacitive element coupled from the third reflection signal terminal to the fourth reflection signal terminal; a third variable capacitive element coupled from the second end of the first inductive element to the first end of the second inductive element; a fourth variable capacitive element coupled from the second end of the third inductive element to the first end of the fourth inductive element.

Aspect 23: The wireless communication apparatus of aspect 22, wherein the first variable capacitive element, the second variable capacitive element, the third variable capacitive element, and the fourth variable capacitive element are positioned to create a moderate capacitive coupling.

Aspect 24: The wireless communication apparatus of aspect 23, wherein the moderate capacitive coupling is approximately 40 femtofarads (fF).

Aspect 25: The wireless communication apparatus of any of aspects 22 through 24, wherein the first inductive element, the second inductive element, the third inductive element, and the fourth inductive element are positioned to create a moderate magnetic coupling.

Aspect 26: The wireless communication apparatus of aspect 25, wherein the moderate magnetic coupling results in a coupling value between inductive elements of between 0.3 and 0.5.

Aspect 27: The wireless communication apparatus of any of aspects 22 through 26, further comprising: a first transformer coupled across the bi-directional differential input; and a second transformer coupled across the bi-directional differential output.

Aspect 28: A method for operating a wireless apparatus comprising: receiving a communication signal; and adjusting a phase of the communication signal using a bi-directional reflection type phase shifter comprising: a phase shifter; and variable load terminations coupled to the phase shifter, the variable load terminations comprising a plurality of variable capacitive elements and a plurality of inductive elements; wherein the plurality of variable capacitive elements are positioned to create a moderate capacitive coupling sufficient to impact an insertion loss at an apparatus operating frequency; and wherein the plurality of inductive elements are positioned to create a magnetic coupling between the plurality of inductive elements sufficient to impact the insertion loss at the apparatus operating frequency.

Aspect 29: The method of aspect 28, wherein the phase shifter includes a 90-degree phase shifter.

What is claimed is:

1. A wireless communication apparatus, comprising:
a reflective coupler with a tuned termination comprising
a first reflection signal terminal, a second reflection signal terminal, a third reflection signal terminal, and a fourth reflection signal terminal;
a first variable capacitive element coupled from the first reflection signal terminal to the second reflection signal terminal;
a second variable capacitive element coupled from the third reflection signal terminal to the fourth reflection signal terminal;
a first inductive element having a first end and a second end, wherein the first end of the first inductive element is coupled to the first reflection signal terminal;
a second inductive element having a first end coupled to the second end of the first inductive element, and a second end coupled to the third reflection signal terminal;
a third inductive element having a first end and a second end, wherein the first end of the third inductive element is coupled to the second reflection signal terminal;
a fourth inductive element having a first end coupled to the second end of the third inductive element, and a second end coupled to the fourth reflection signal terminal;
a third variable capacitive element coupled from the second end of the first inductive element to the second end of the third inductive element; and
a fourth variable capacitive element coupled from the first end of the second inductive element to the first end of the fourth inductive element.

2. The wireless communication apparatus of claim 1, wherein the first variable capacitive element, the second variable capacitive element, the third variable capacitive element, and the fourth variable capacitive element are positioned to create a moderate capacitive coupling.

3. The wireless communication apparatus of claim 2, wherein the first inductive element, the second inductive element, the third inductive element, and the fourth inductive element are positioned to create a moderate magnetic coupling.

4. The wireless communication apparatus of claim 3, wherein the moderate magnetic coupling results in a coupling value between inductive elements of between 0.3 and 0.5.

5. The wireless communication apparatus of claim 4, wherein the moderate capacitive coupling is approximately between 30 femtofarads (fF) and 50 fF.

6. The wireless communication apparatus of claim 1, wherein a capacitance of the first variable capacitive element and a capacitance of the second variable capacitive element are a same capacitive value.

7. The wireless communication apparatus of claim 6, wherein the capacitance of the first variable capacitive element shared capacitive value is tunable in a range from 60 femtofarads (fF) to 140 fF, and wherein the capacitance of the second variable capacitive element is tunable from 60 fF to 140 fF.

8. The wireless communication apparatus of claim 1, further comprising control circuitry coupled to the first variable capacitive element, the second variable capacitive element, the third variable capacitive element, and the fourth variable capacitive element, wherein the control circuitry is configured to select capacitive values to set a phase shift value.

9. The wireless communication apparatus of claim 1 further comprising a phase shift component comprising a first phase shift input, a second phase shift input, the first reflection signal terminal, the second reflection signal terminal, the third reflection signal terminal, the fourth reflection signal terminal, a first phase shift output, and a second phase shift output.

10. The wireless communication apparatus of claim 9, further comprising a variable gain amplifier coupled to the phase shift component.

11. The wireless communication apparatus of claim 10, wherein the variable gain amplifier comprises a bi-directional single-ended input, a gain control, a phase calibration element, amplitude control circuitry, and a bi-directional single ended output.

12. The wireless communication apparatus of claim 11, further comprising a transmit path coupled to the variable gain amplifier.

13. The wireless communication apparatus of claim 1, wherein the wireless communication apparatus comprises a bi-directional reflection type phase shifter.

14. The wireless communication apparatus of claim 13, wherein the wireless communication apparatus comprises a phased array element.

15. The wireless communication apparatus of claim 14, the phased array element further comprising a transmit path and a receive path, wherein the transmit path comprises the bi-directional reflection type phase shifter, and wherein the receive path comprises the bi-directional reflection type phase shifter.

16. The wireless communication apparatus of claim 1, wherein the wireless communication apparatus comprises a millimeter wave integrated circuit (mmWIC).

17. The wireless communication apparatus of claim 16, wherein the mmWIC comprises a plurality of phased array elements, and wherein a first phased array element of the plurality of phased array elements comprises the first variable capacitive element, the second variable capacitive element, the third variable capacitive element, the fourth variable capacitive element, the first inductive element, the second inductive element, the third inductive element, and the fourth inductive element.

18. The wireless communication apparatus of claim 17, wherein each phased array element of the plurality of phased array elements comprises a bi-directional reflection type phase shifter.

19. The wireless communication apparatus of claim 3, wherein the moderate capacitive coupling and the moderate magnetic coupling are created using a coupled transformer layout for the first variable capacitive element, the second variable capacitive element, the third variable capacitive element, the fourth variable capacitive element, the first inductive element, the second inductive element, the third inductive element, and the fourth inductive element.

20. The wireless communication apparatus of claim 19, wherein the coupled transformer layout uses a plurality of layers of a millimeter wave integrated circuit (mmWIC).

21. The wireless communication apparatus of claim 3, wherein the moderate capacitive coupling and the moderate magnetic coupling are created using a differential quadrature hybrid layout for the first variable capacitive element, the second variable capacitive element, the third variable capacitive element, the fourth variable capacitive element, the first inductive element, the second inductive element, the third inductive element, and the fourth inductive element.

22. A wireless communication apparatus, comprising:
a 90-degree differential reflective coupler with a tunable termination comprising a first reflection signal terminal, a second reflection signal terminal, a third reflection signal terminal, a fourth reflection signal terminal, a bi-directional differential input, and a bi-direction differential output;
a first inductive element having a first end and a second end, wherein the first end is coupled to the first reflection signal terminal;
a second inductive element having a first end coupled to the second end of the first inductive element, and a second end coupled to the third reflection signal terminal;
a third inductive element having a first end and a second end, wherein the first end of the third inductive element is coupled to the second reflection signal terminal;
a fourth inductive element having a first end coupled to the second end of the third inductive element, and a second end, wherein the second end is coupled to the fourth reflection signal terminal;
a first variable capacitive element coupled from the first reflection signal terminal to the second reflection signal terminal;
a second variable capacitive element coupled from the third reflection signal terminal to the fourth reflection signal terminal;
a third variable capacitive element coupled from the second end of the first inductive element to the second end of the third inductive element; and
a fourth variable capacitive element coupled from the first end of the second inductive element to the first end of the fourth inductive element.

23. The wireless communication apparatus of claim 22, wherein the first variable capacitive element, the second variable capacitive element, the third variable capacitive element, and the fourth variable capacitive element are positioned to create a moderate capacitive coupling.

24. The wireless communication apparatus of claim 23, wherein the moderate capacitive coupling is approximately 40 femtofarads (fF).

25. The wireless communication apparatus of claim 22, wherein the first inductive element, the second inductive element, the third inductive element, and the fourth inductive element are positioned to create a moderate magnetic coupling.

26. The wireless communication apparatus of claim 25, wherein the moderate magnetic coupling results in a coupling value between inductive elements of between 0.3 and 0.5.

27. The wireless communication apparatus of claim 22, further comprising:
a first transformer coupled across the bi-directional differential input; and
a second transformer coupled across the bi-directional differential output.

28. A method for operating a wireless apparatus comprising:
receiving a communication signal; and
adjusting a phase of the communication signal using a bi-directional reflection type phase shifter comprising:
a phase shifter comprising a reflective coupler with a tuned termination comprising a first reflection signal terminal, a second reflection signal terminal, a third reflection signal terminal, and a fourth reflection signal terminal; and
variable load terminations coupled to the phase shifter, the variable load terminations comprising:
a first variable capacitive element coupled from the first reflection signal terminal to the second reflection signal terminal;

a second variable capacitive element coupled from the third reflection signal terminal to the fourth reflection signal terminal;

a first inductive element having a first end and a second end, wherein the first end of the first inductive element is coupled to the first reflection signal terminal;

a second inductive element having a first end coupled to the second end of the first inductive element, and a second end coupled to the third reflection signal terminal;

a third inductive element having a first end and a second end, wherein the first end of the third inductive element is coupled to the second reflection signal terminal;

a fourth inductive element having a first end coupled to the second end of the third inductive element, and a second end coupled to the fourth reflection signal terminal;

a third variable capacitive element coupled from the second end of the first inductive element to the second end of the third inductive element; and a fourth variable capacitive element coupled from the first end of the second inductive element to the first end of the fourth inductive element;

wherein the first variable capacitive element, the second variable capacitive element, the third variable capacitive element, and the fourth variable capacitive element are positioned to create a moderate capacitive coupling sufficient to impact an insertion loss at an apparatus operating frequency; and wherein the first inductive element, the second inductive element, the third inductive element, and the fourth inductive element are positioned to create a magnetic coupling between inductive elements sufficient to impact the insertion loss at the apparatus operating frequency.

29. The method of claim 28, wherein the phase shifter includes a 90-degree phase shifter.

* * * * *